(12) United States Patent
Chen et al.

(10) Patent No.: US 11,145,844 B2
(45) Date of Patent: Oct. 12, 2021

(54) METHOD FOR MANUFACTURING ELECTROLUMINESCENT DEVICE

(71) Applicant: INT TECH CO., LTD., Hsinchu County (TW)

(72) Inventors: Huei-Siou Chen, Taipei (TW); Yi-Cheng Liu, Yilan County (TW); Li-Chen Wei, Taichung (TW)

(73) Assignee: INT TECH CO., LTD., Hsinchu County (TW)

( * ) Notice: Subject to any disclaimer, the term of this patent is extended or adjusted under 35 U.S.C. 154(b) by 70 days.

(21) Appl. No.: 16/748,283

(22) Filed: Jan. 21, 2020

(65) Prior Publication Data

US 2020/0274110 A1    Aug. 27, 2020

Related U.S. Application Data

(60) Provisional application No. 62/811,279, filed on Feb. 27, 2019.

(51) Int. Cl.
*H01L 51/56* (2006.01)
*H01L 51/00* (2006.01)

(52) U.S. Cl.
CPC ............ *H01L 51/56* (2013.01); *H01L 51/003* (2013.01); *H01L 51/0018* (2013.01)

(58) Field of Classification Search
None
See application file for complete search history.

(56) References Cited

U.S. PATENT DOCUMENTS

| 8,493,390 B2 | 7/2013 | Kalinli |
| 2010/0117936 A1 | 5/2010 | Lhee et al. |

(Continued)

FOREIGN PATENT DOCUMENTS

| CN | 103413819 A | 11/2013 |
| CN | 106816461 A | 6/2017 |

(Continued)

OTHER PUBLICATIONS

Office Action, Cited References and Search Report (Search Report alone dated Jan. 4, 2021) dated Jan. 5, 2021 issued by the Taiwan Intellectual Property Office for the Taiwan counterpart application No. 109106325.

(Continued)

*Primary Examiner* — J. E. Schoenholtz
(74) *Attorney, Agent, or Firm* — WPAT, P.C.; Anthony King

(57) ABSTRACT

A method of manufacturing an electroluminescent device includes the following steps. A substrate including a first sub-pixel region and a second sub-pixel region is provided. A first light-emitting layer is formed over the substrate through a shadow mask to cover the first sub-pixel region and at least a portion of the second sub-pixel region. A sacrificial layer is formed over the substrate, wherein the sacrificial layer includes an opening exposing a portion of the first light-emitting layer that is over the second sub-pixel region. The portion of the first light-emitting layer that is over the second sub-pixel region is removed. A second light-emitting layer is formed over the sacrificial layer and on the second sub-pixel region through the opening of the sacrificial layer. The sacrificial layer is removed simultaneously with a portion of the second light-emitting layer that is over the sacrificial layer.

19 Claims, 37 Drawing Sheets

(56) References Cited

U.S. PATENT DOCUMENTS

| | | | | |
|---|---|---|---|---|
| 2012/0274239 | A1* | 11/2012 | Endo | H01L 51/0018 |
| | | | | 315/312 |
| 2013/0299810 | A1 | 11/2013 | Sonoda et al. | |
| 2014/0315336 | A1 | 10/2014 | Yoo et al. | |
| 2015/0194629 | A1 | 7/2015 | Liu et al. | |
| 2017/0025610 | A1* | 1/2017 | Kwon | H01L 51/0018 |
| 2017/0038590 | A1 | 2/2017 | Jepsen | |
| 2017/0039904 | A1 | 2/2017 | Jepsen | |
| 2017/0365812 | A1 | 12/2017 | Choung et al. | |
| 2018/0261656 | A1* | 9/2018 | Kim | H01L 51/0016 |
| 2020/0035956 | A1* | 1/2020 | Bai | H01L 51/0096 |
| 2020/0212336 | A1* | 7/2020 | Heo | H01L 51/5088 |
| 2021/0057497 | A1* | 2/2021 | Hou | H01L 51/0018 |

FOREIGN PATENT DOCUMENTS

| | | | |
|---|---|---|---|
| CN | 109065761 | A | 12/2018 |
| TW | 201019785 | A1 | 5/2010 |
| TW | 201235488 | A1 | 9/2012 |
| TW | 201801302 | A | 1/2018 |
| TW | 201801302 | A | 1/2018 |
| TW | 201842691 | A | 12/2018 |
| WO | 2018161704 | A1 | 9/2018 |
| WO | WO2020019481 | A1 | 1/2020 |

OTHER PUBLICATIONS

English Summary for the Office Action dated Jan. 5, 2021 and English Translation for the Search Report dated Jan. 4, 2021, issued by the Taiwan Intellectual Property Office for the Taiwan counterpart application No. 109106325.
US20100117936A1 corresponds to TW201019785A.
US20150194629A1 corresponds to CN103413819A.
English Abstract of CN109065761A.
WO2020019481A1 corresponds to CN109065761A.
Office Action, Cited References and Search Report (Search Report alone dated Jan. 5, 2021) dated Jan. 6, 2021 issued by the Taiwan Intellectual Property Office for the Taiwan counterpart application No. 109106326.
English Summary for the Office Action dated Jan. 6, 2021 and English Translation for the Search Report dated Jan. 5, 2021, issued by the Taiwan Intellectual Property Office for the Taiwan counterpart application No. 109106326.
Office Action, Cited References and Search Report (Search Report alone dated Apr. 16, 2021) dated Apr. 19, 2021 issued by the Taiwan Intellectual Property Office for the Taiwanese Counterpart Application No. 109106325.
English Summary of Office Action and Search Report (Search Report alone dated Apr. 16, 2021) dated Apr. 19, 2021 issued by the Taiwan Intellectual Property Office for the Taiwanese Counterpart Application No. 109106325.
US20130299810A1 Corresponds to TW201235488A1.
US20180261656A1 Corresponds to TW201842691A.
US20100117936 A1 Corresponds to TW201019785A1.
US20170365812A1 Corresponds to TW201801302A.
WO2018161704 A1 Corresponds to CN106816461A.

* cited by examiner

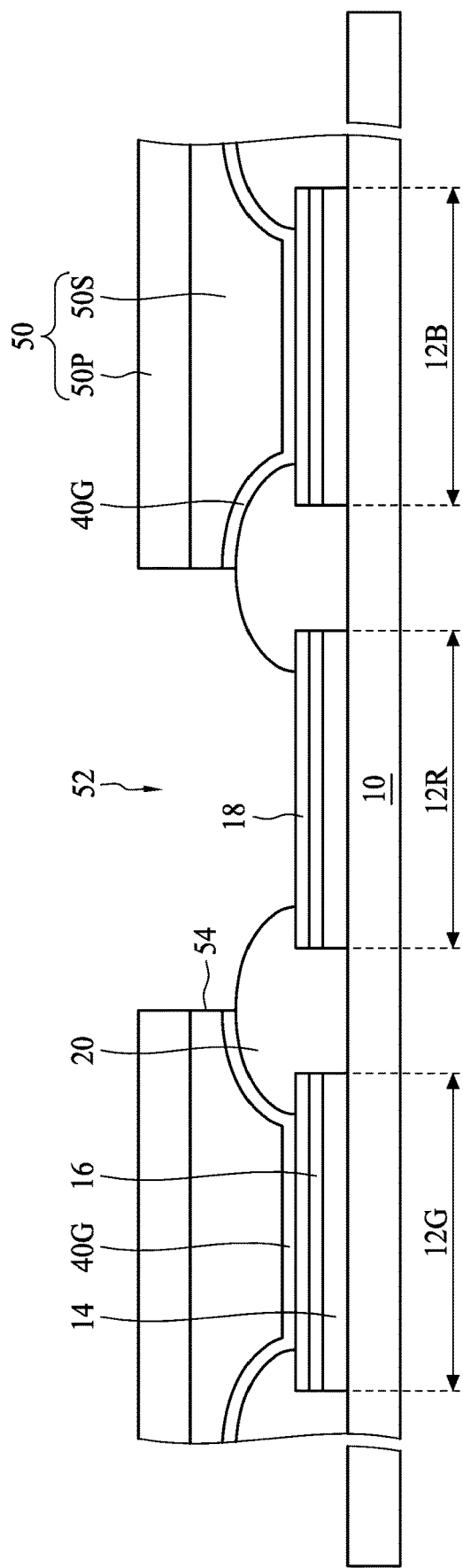

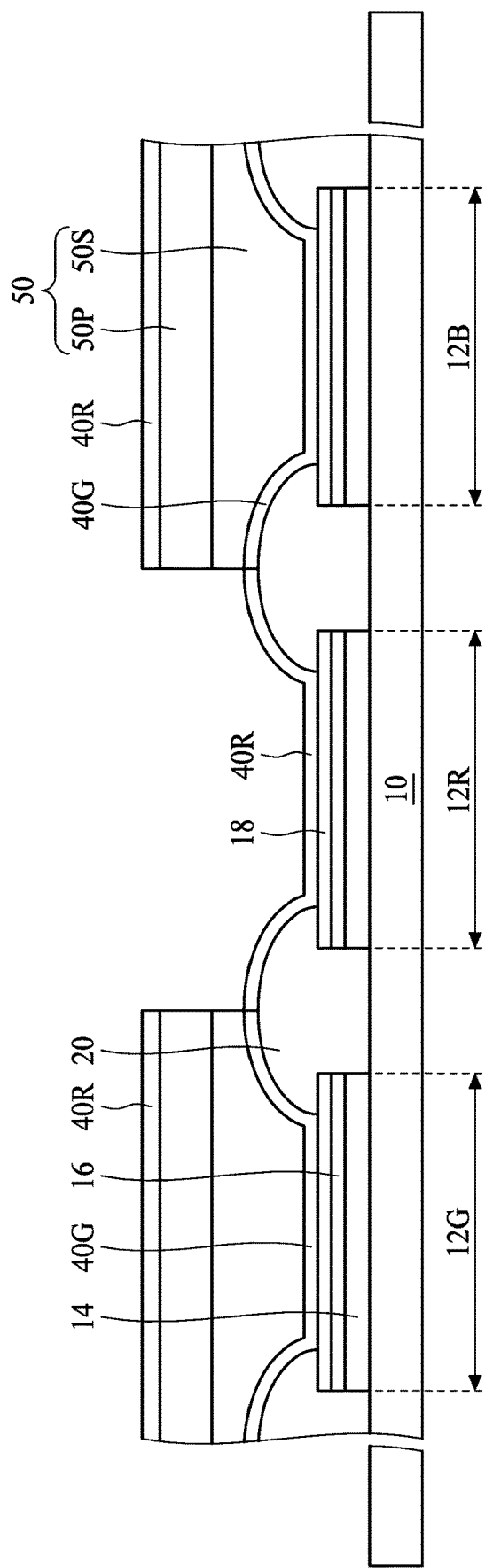

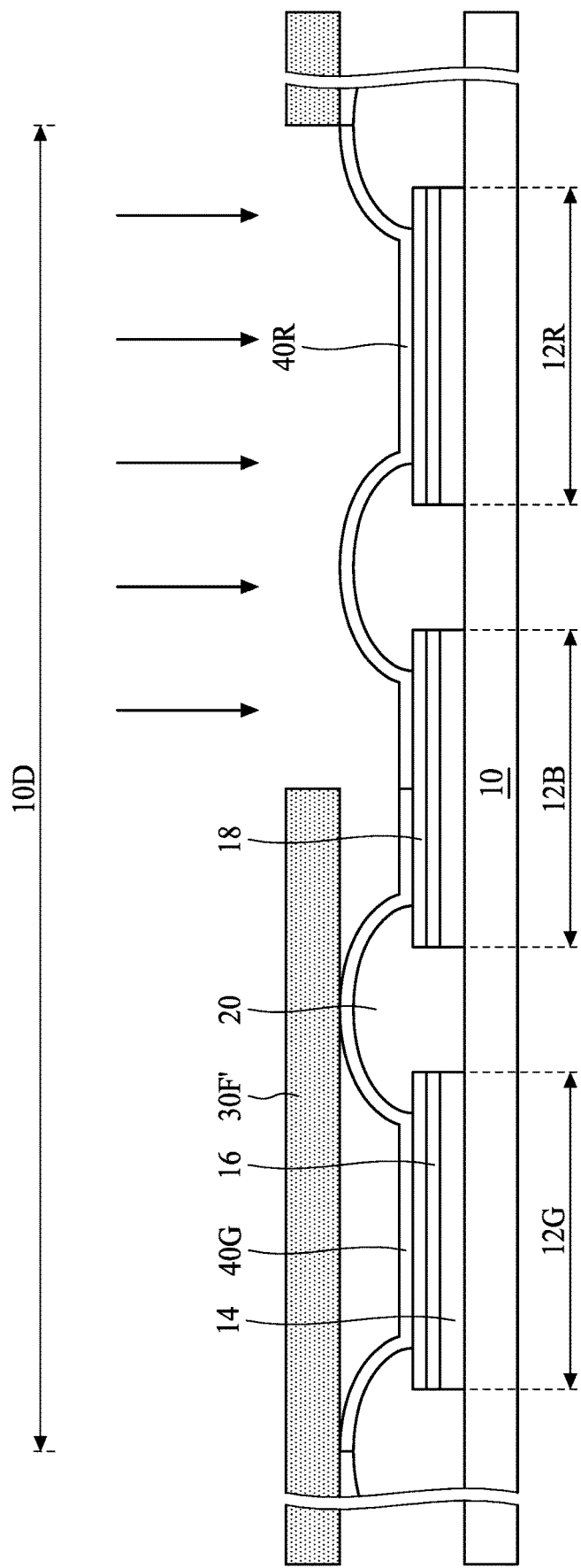

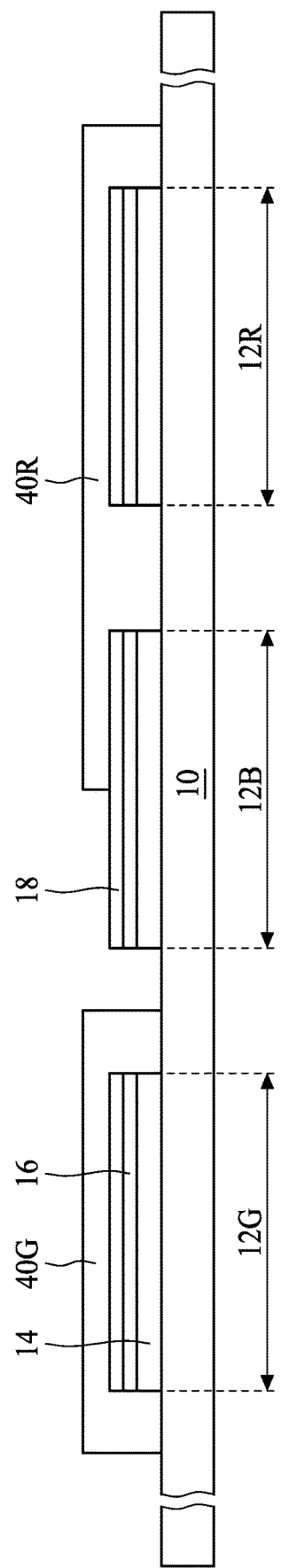

METHOD FOR MANUFACTURING ELECTROLUMINESCENT DEVICE

PRIORITY CLAIM AND CROSS REFERENCE

This application claims the benefits of U.S. Provisional Application Ser. No. 62/811,279, filed on Feb. 27, 2019, which is hereby incorporated herein by reference in its entirety.

TECHNICAL HELD

The present disclosure is related to a method for manufacturing an electroluminescent device, and more particularly, to a method for manufacturing an organic light-emitting device.

BACKGROUND

Organic light-emitting diodes (OLED) have been widely used in displays due to their advantages in latency, contrast ratio, response time, and black levels. However, due to the constraints of current color patterning technologies, the commercialization of high-resolution OLED displays remains limited. Related manufacturing issues include low manufacturing yield, high fabrication cost, and low display quality. Therefore, the OLED industry is seeking routes to address the above issues.

SUMMARY

A method of manufacturing an electroluminescent device includes providing a substrate including a first sub-pixel region and a second sub-pixel region configured to display an image of a first color and an image of a second color, respectively; forming a first light-emitting layer over the substrate to cover the first sub-pixel region and at least a portion of the second sub-pixel region; forming a first sacrificial layer over the substrate, wherein the first sacrificial layer covers a portion of the first light-emitting layer that is over the first sub-pixel region, and the first sacrificial layer includes a first opening exposing a portion of the first light-emitting layer that is over the second sub-pixel region; removing the portion of the first light-emitting layer that is over the second sub-pixel region and that is exposed through the first opening of the first sacrificial layer; forming a second light-emitting layer over the first sacrificial layer and over the second sub-pixel region through the first opening of the first sacrificial layer; and removing the first sacrificial layer simultaneously with a portion of the second light-emitting layer that is over the first sacrificial layer by a lift-off process.

In some embodiments, the substrate further includes a third sub-pixel region configured to display an image of a third color. In some embodiments, the first light-emitting layer is formed by inject printing and the first light-emitting layer covers the first sub-pixel region, the second sub-pixel region and the third sub-pixel region. In some embodiments, the first light-emitting layer is formed through a common metal mask having a hole aligned with the first sub-pixel region, the second sub-pixel region and the third sub-pixel region, the first light-emitting layer covers the first sub-pixel region, the second sub-pixel region and the third sub-pixel region, and the first sacrificial layer further covers the third sub-pixel region.

In some embodiments, the method further includes forming a second sacrificial layer over the substrate, wherein the second sacrificial layer covers the portion of the first light-emitting layer that is over the first sub-pixel region, the second sacrificial layer further covers the second light-emitting layer that is over the second sub-pixel region, and the second sacrificial layer includes a second opening exposing a portion of the first light-emitting layer that is over the third sub-pixel region; removing the portion of the first light-emitting layer that is over the third sub-pixel region and is exposed through the second opening of the second sacrificial layer; forming a third light-emitting layer over the second sacrificial layer and on the third sub-pixel region through the second opening of the second sacrificial layer; and removing the second sacrificial layer simultaneously with a portion of the third light-emitting layer that is over the second sacrificial layer by a lift-off process.

In some embodiments, the substrate further includes a third sub-pixel region configured to display an image of a third color. In some embodiments, the first light-emitting layer is formed through a first fine metal mask having a hole aligned with the first sub-pixel region and a portion of the second sub-pixel region, and the first light-emitting layer covers the first sub-pixel region and a portion of the second sub-pixel region.

In some embodiments, the method further includes, prior to the forming of the first sacrificial layer, forming a third light-emitting layer over the substrate through a second fine metal mask to cover the third sub-pixel region and another portion of the second sub-pixel region; and after the forming of the first sacrificial layer, removing a portion of the third light-emitting layer that is over the second sub-pixel region and that is exposed through the first opening of the first sacrificial layer simultaneously with the removing of the first light-emitting layer.

In some embodiments, the method further includes forming a second sacrificial layer over the substrate prior to the forming of the first light-emitting layer, wherein the second sacrificial layer covers the first sub-pixel region and the second sub-pixel region, and the second sacrificial layer includes a second opening exposing the third sub-pixel region; forming a third light-emitting layer over the second sacrificial layer and over the third sub-pixel region, through the second opening of the second sacrificial layer; and removing the second sacrificial layer simultaneously with a portion of the third light-emitting layer that is over the second sacrificial layer by a lift-off process.

In some embodiments, the first sacrificial layer includes a photosensitive layer patterned by a photolithography process. In some embodiments, the first sacrificial layer further includes a releasing layer between the substrate and the photosensitive layer. In some embodiments, the first sacrificial layer further includes a barrier layer between the photosensitive layer and the releasing layer. In some embodiments, the method further includes patterning the barrier layer by a dry etching process. In some embodiments, the method further includes patterning the releasing layer by a dry etching process. In some embodiments, the method further includes patterning the releasing layer by a wet etching process.

In some embodiments, the method further includes forming a pixel-defining layer over the substrate to separate the first sub-pixel region from the second sub-pixel region prior to the forming of the first light-emitting layer. In some embodiments, the method further includes forming a plurality of electrodes over the substrate prior to the forming of the first light-emitting layer. In some embodiments, the method further includes forming a conductive layer over the substrate after the removing of the first sacrificial layer.

A method of manufacturing a light-emitting device includes providing a substrate including a first pixel, a second pixel and a third pixel configured to emit different colors; forming a first light-emitting layer over the substrate through a first shadow mask to cover the first pixel and at least a portion of the third pixel; forming a second light-emitting layer over the substrate through a second shadow mask to cover the second pixel and at least a portion of the third pixel; forming a photosensitive layer over the substrate, wherein the photosensitive layer covers a portion of the first light-emitting layer that is over the first pixel and a portion of the second light-emitting layer that is over the second pixel, and the photosensitive layer exposes portions of the first light-emitting layer and the second light-emitting layer that are over the third pixel; removing the portions of the first light-emitting layer and the second light-emitting layer that are exposed through the photosensitive layer; forming a third light-emitting layer over the photosensitive layer and over the third pixel; and removing the photosensitive layer simultaneously with a portion of the third light-emitting layer that is over the photosensitive layer.

A method of manufacturing a display panel includes forming a first light-emitting layer over a substrate through a shadow mask, wherein the substrate includes a first pixel, a second pixel and a third pixel; removing a portion of the first light-emitting layer that is over the second pixel and is exposed through a first photosensitive layer; forming a second light-emitting layer over the first photosensitive layer and over the second pixel, and removing the first photosensitive layer simultaneously with a portion of the second light-emitting layer that is over the first photosensitive layer; removing a portion of the first light-emitting layer that is over the third pixel and is exposed through a second photosensitive layer; forming a third light-emitting layer over the second photosensitive layer and over the third pixel; and removing the second photosensitive layer simultaneously with a portion of the third light-emitting layer that is over the second photosensitive layer.

BRIEF DESCRIPTION OF THE DRAWINGS

FIGS. 6A to 6G illustrate a method of manufacturing an electroluminescent device according to some embodiments of the present disclosure.

FIGS. 7A to 7L illustrate a method of manufacturing an electroluminescent device according to some embodiments of the present disclosure.

DETAILED DESCRIPTION OF THE DISCLOSURE

Figure 1:
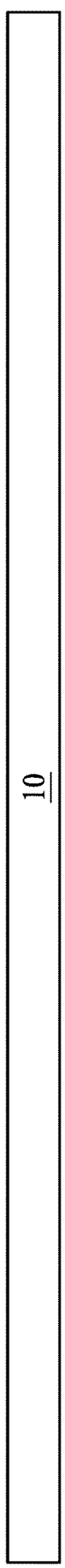
FIG. 1 illustrates a substrate of an electroluminescent device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To achieve successful commercialization of high-resolution OLED displays, a method with low cost and high productivity is desired. One color patterning method for OLED displays is the shadow masking method. RGB color patterning is performed by sequential vacuum deposition of red, green and blue materials through a pre-patterned shadow mask. This technique is widely used due to its low fabrication cost and exposure-free property. However, this method has several drawbacks, including potential for misalignment of the pattern due to the deformation of shadow masks and low resolution due to the constraints imposed by the use of the shadow mask. These limitations constrain the display aperture ratio, reduce the manufacturing yield, and limit the display resolution.

Another color patterning method for OLED displays is the photolithography method. RGB color patterning is performed by lift-off processes of red, green and blue materials through a patterned photomask. This technique is widely used due to the high resolution of the displays produced. However, this method has several inherent limitations, including OLED degradation due to UV light exposure, and high fabrication cost due to the expensive production procedures of the photomask. These limitations present obstacles to the successful commercialization of high-resolution OLED displays and result in reduced display quality.

Embodiments of manufacturing methods of display panels are provided. In the present disclosure, an organic light-emitting layer in the OLED is formed by a hybrid process that includes a photolithography process and a shadow masking process. Specifically, the manufacturing methods of the present disclosure combine the advantages of the shadow masking process with the advantages of the photolithography process. By combining the photolithography method with the shadow masking method, a significant reduction of the cost of the manufacturing process may be achieved. Further, the resolution of the display panels may be enhanced since at least one color patterning process is performed during the photolithography process. Moreover, the organic light-emitting layers suffer less damage during the photolithography process since at least one color patterning process is performed by the shadow masking process. Therefore, high-resolution display panels may be formed in a cost-effective way.

Figure 2:
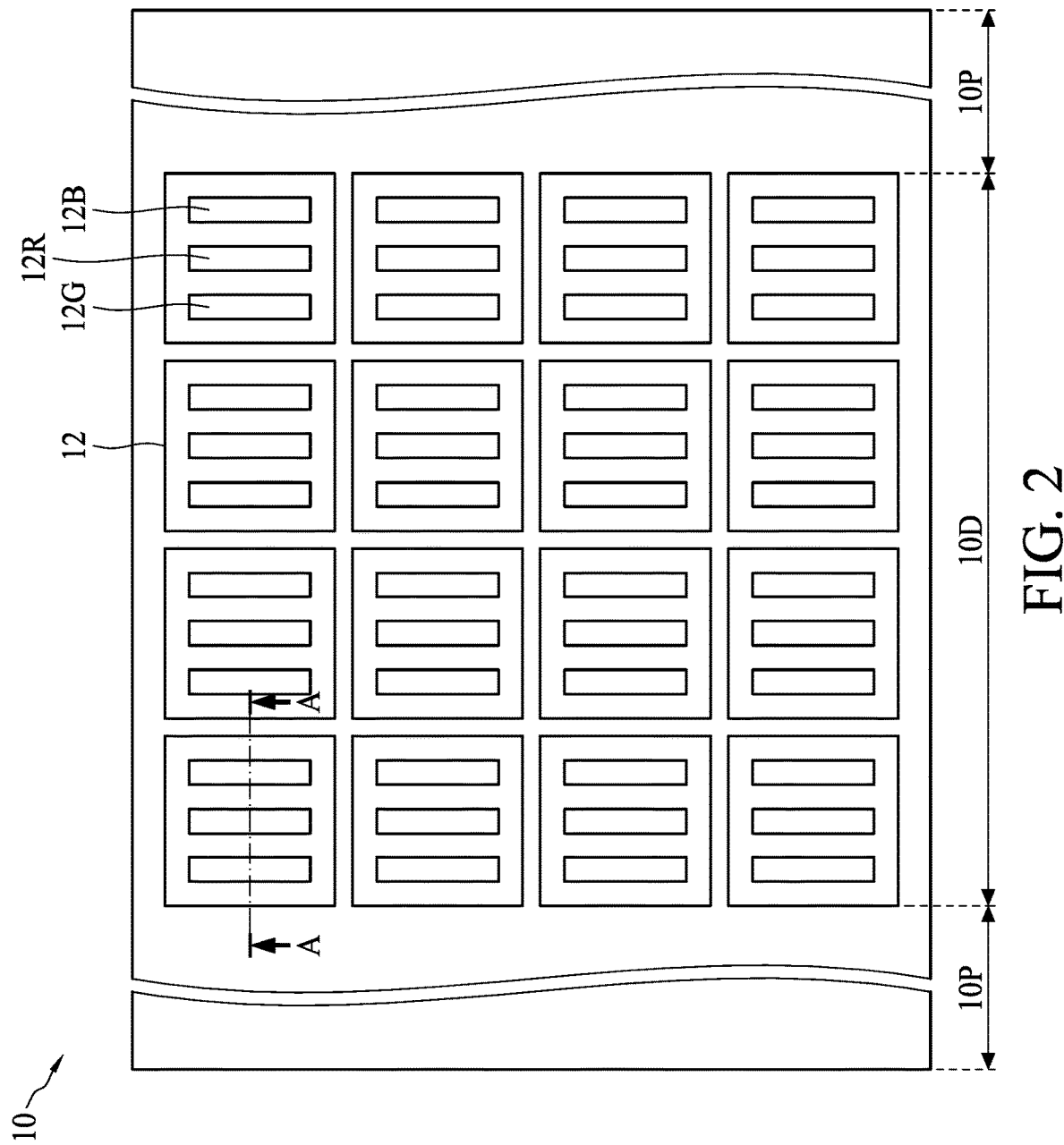
FIG. 2 illustrates a top view of the substrate of the electroluminescent device according to some embodiments of the present disclosure.

FIG. 1 illustrates a substrate of an electroluminescent device in accordance with some embodiments. FIG. 2 illustrates a top view of the substrate of the electroluminescent device according to some embodiments of the present disclosure. As shown in FIG. 1, a substrate 10 is provided. The electroluminescent device may be a light-emitting device. By way of example, the electroluminescent device may be an organic light-emitting diode (OLED).

As shown in FIG. 2, the substrate 10 of a display panel includes a display area 10D and a peripheral area 10P. The substrate 10 further includes a plurality of pixels 12 in the display area 10D. The pixels 12 can be arranged in an array. Each independent pixel 12 is separated from other adjacent pixels 12. Each pixel 12 includes a first sub-pixel 12G, a second sub-pixel 12R and a third sub-pixel 12B. In some embodiments, the sub-pixel may be also referred to as the sub-pixel region or the pixel.

The first sub-pixel 12G, the second sub-pixel 12R and the third sub-pixel 12B may be configured to display different colors. Specifically, the first sub-pixel 12G, the second sub-pixel 12R and the third sub-pixel 12B may be configured to emit an image of a first color, an image of a second color and an image of a third color, respectively. For example, the first sub-pixel 12G may be configured to display the color green, the second sub-pixel 12R may be configured to display the color red and the third sub-pixel 12B may be configured to display the color blue.

Figure 6A:
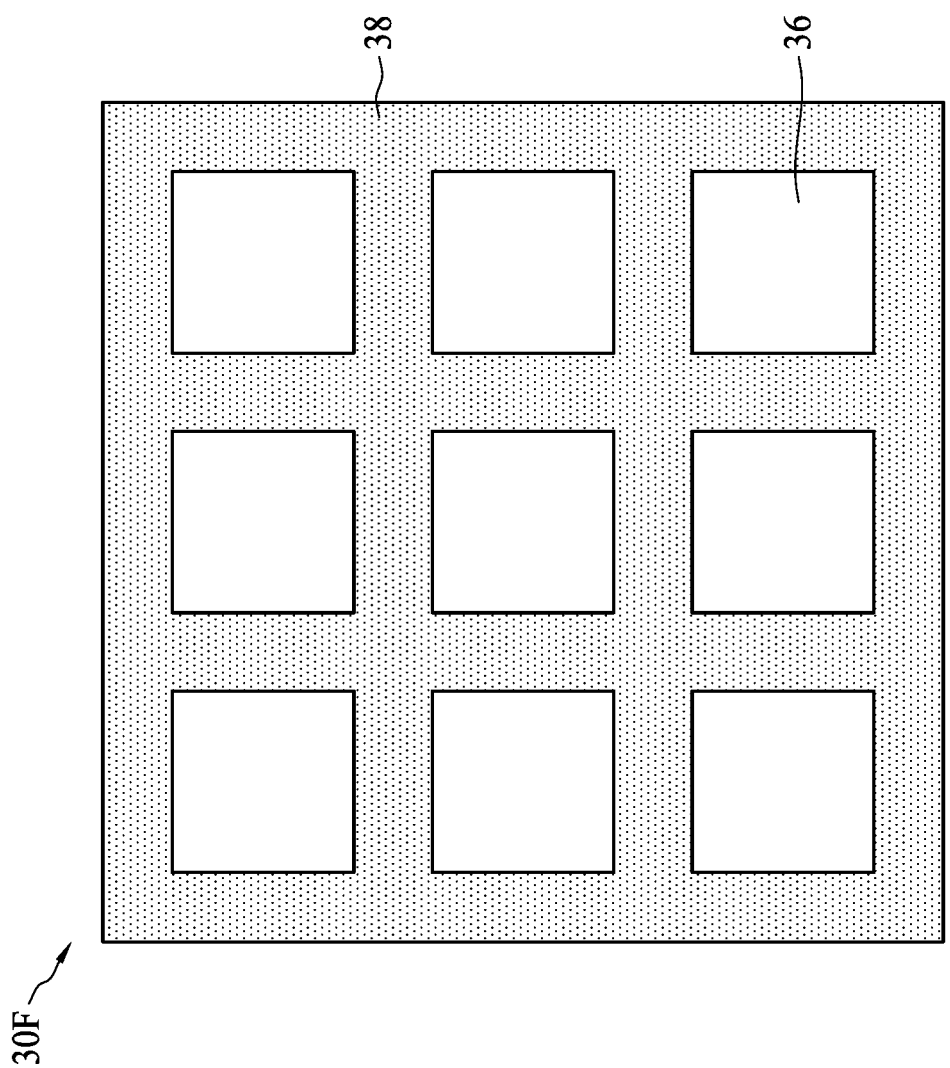
Figure 6B:
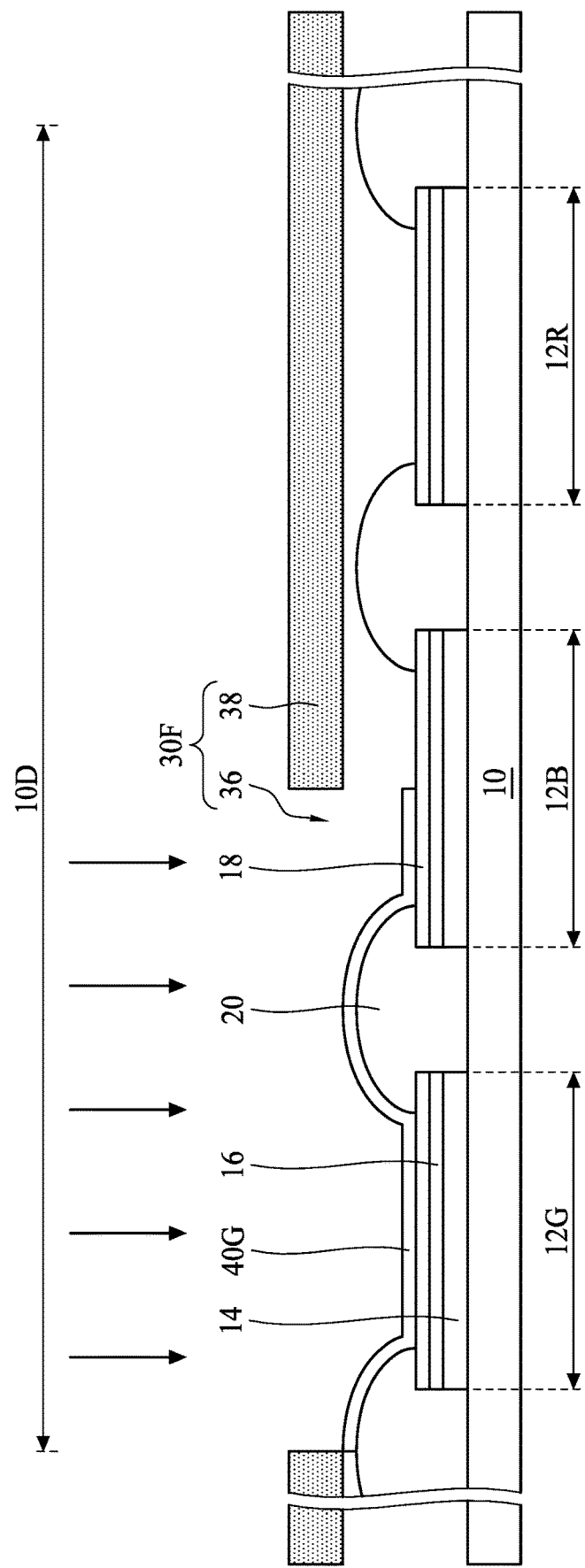

As shown in FIG. 2, the arrangement of the sub-pixels includes, from left to right, the first sub-pixel 12G, the second sub-pixel 12R and then the third sub-pixel 12B, but is not limited thereto. The configuration of the sub-pixels may be altered according to the design or other considerations. For example, the arrangement of the sub-pixels may include, from left to right, the first sub-pixel 12G, the third sub-pixel 12B, then the second sub-pixel 12R, as shown in FIG. 6B. Further, although the shapes of the sub-pixels illustrated in FIG. 2 are squares, the sub-pixels may have other suitable shapes. In addition, the number of sub-pixels in one pixel 12 may be, but is not limited to, three sub-pixels, the number of sub-pixels may be altered and there may be other suitable sub-pixels configured to display different colors, such as yellow, white or other colors.

The substrate 10 may be a rigid or a flexible substrate. In addition, the substrate 10 may be an opaque or a transparent substrate. The substrate 10 can include glass, quartz, semi-conductive material such as silicon, III-V group compound, or other suitable material. In some embodiments, the substrate 10 includes graphene. In some embodiments, the substrate 100 may be formed with a polymer matrix material. A dielectric layer (not shown) may be optionally disposed over the substrate 10. In some embodiments, the dielectric layer may be made with silicon oxide, silicon nitride, silicon oxynitride, or other suitable materials.

Figure 3:
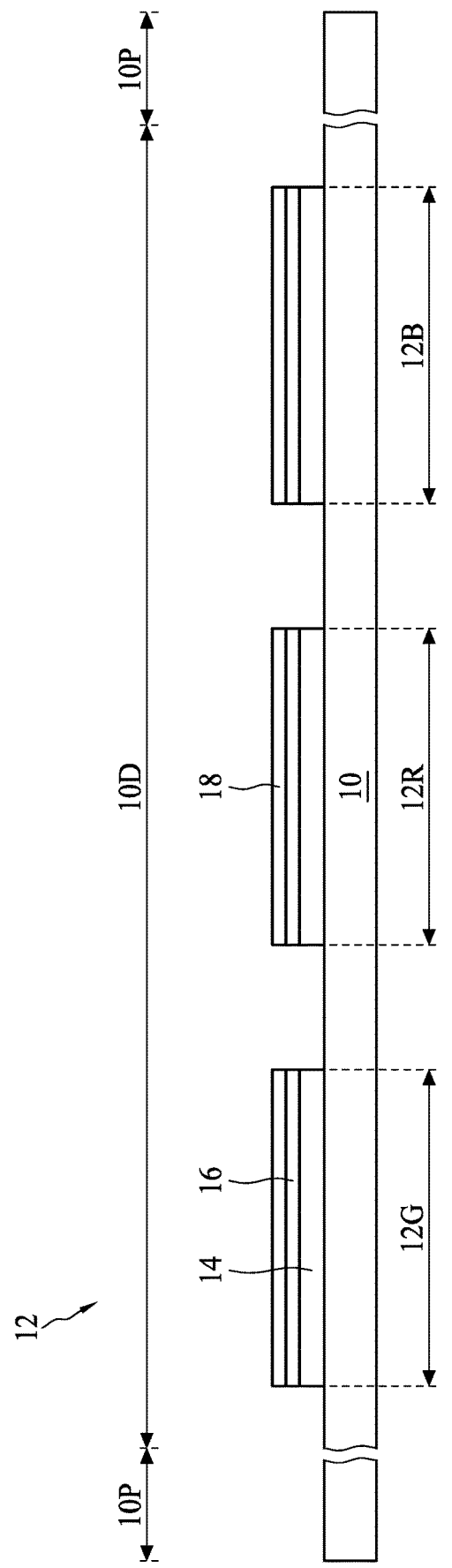
FIG. 3 is a schematic cross-sectional view of a pixel along line A-A of FIG. 2 in accordance with some embodiments.

FIG. 3 is a schematic cross-sectional view of a pixel along line A-A of FIG. 2 in accordance with some embodiments. As shown in FIG. 3, a plurality of electrodes 14 are formed over the substrate 10. The electrodes 14 may include opaque conductive materials or transparent conductive materials. Examples of the opaque conductive materials may include metal such as aluminum (Al), copper (Cu), silver (Ag), gold (Au), tungsten (W), another metal, or a metal alloy. Examples of the transparent conductive materials may include indium tin oxide (ITO), indium zinc oxide (WO), aluminum-doped zinc oxide (AZO), indium-doped cadmium oxide, or other similar materials. In some embodiments, the electrodes 14 are designed as the anodes of the electroluminescent device.

Referring to FIG. 3 again, several electrodes 14 are disposed over the substrate 10. In some embodiments, the substrate 10 includes a driving circuit such as a TFT (thin film transistor) array. The pattern of the electrodes 14 is designed in accordance with a desired pixel arrangement. The electrodes 14 may be electrically connected to the driving circuit in the substrate 10 to receive driving signals for driving the electroluminescent device.

Although only a single pixel 12 is illustrated in FIG. 3, the manufacturing method may include manufacturing a plurality of the pixels 12. Each sub-pixel includes an electrode 14. In some embodiments, the formation of the electrodes 14 includes forming a conductive layer, forming a mask layer over the conductive layer, etching the portions of the conductive layer not covered by the mask layer to form the plurality of electrodes 14, and removing the mask layer.

Optionally, a first carrier injection layer 16 and a first carrier transportation layer 18 are formed over the substrate 10. The first carrier injection layer 16 and the first carrier transportation layer 18 may be formed by procedures similar to those performed for forming the plurality of electrodes 14 discussed above. The first carrier injection layer 16 and the first carrier transportation layer 18 may be formed by the same patterning process, but are not limited thereto. The first carrier injection layer 16 and the first carrier transportation layer 18 may be formed by different patterning processes. The first carrier injection layer 16 may be configured for hole injection or electron injection. The first carrier transportation layer 18 may be configured for hole transportation or electron transportation.

Figure 4:
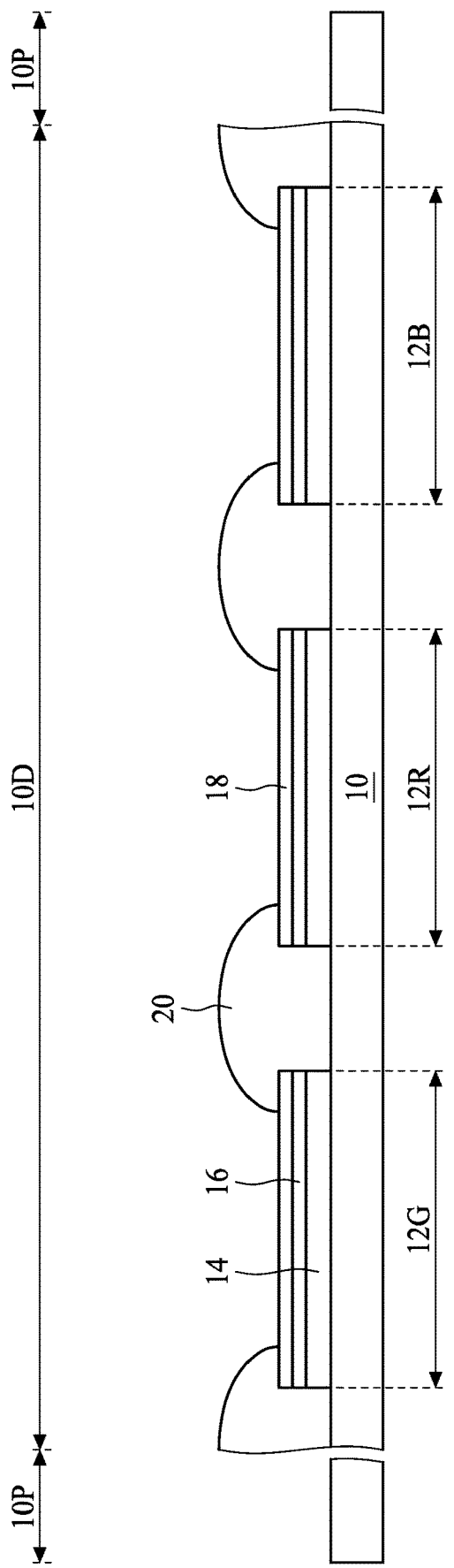
FIG. 4 is a schematic cross-sectional view of a pixel in accordance with some embodiments.

FIG. 4 is a schematic cross-sectional view of a pixel in accordance with some embodiments. As shown in FIG. 4, a pixel-defining layer (also referred to as a PDL) 20 is optionally formed over the substrate to separate the first sub-pixel 12R, the second sub-pixel 12G and the third sub-pixel 12B. The pixel-defining layer 20 separates the electrodes 14 from one another when viewed in a thickness direction of the electroluminescent device. In some embodiments, the pixel-defining layer 20 partially covers the electrodes 14 and leaves a portion of the electrodes 14 open to receive the light-emitting layers.

The pixel-defining layer 20 can be formed in different shapes. As shown in FIG. 4, the cross section of the pixel-defining layer 20 may have a curved surface. In some embodiments, the shape of pixel-defining layer 20 may be a trapezoid. The pixel-defining layers 20 can be arranged in a grid when viewed in the thickness direction of the electroluminescent device. The pattern of the pixel-defining layer 20 is designed in accordance with the desired pixel arrangement. In some embodiments, the pixel-defining layer 20 includes polymeric material, photosensitive material or photo absorption material. In some embodiments, the pixel-defining layer 20 is formed through a photolithography operation.

Figure 5A:
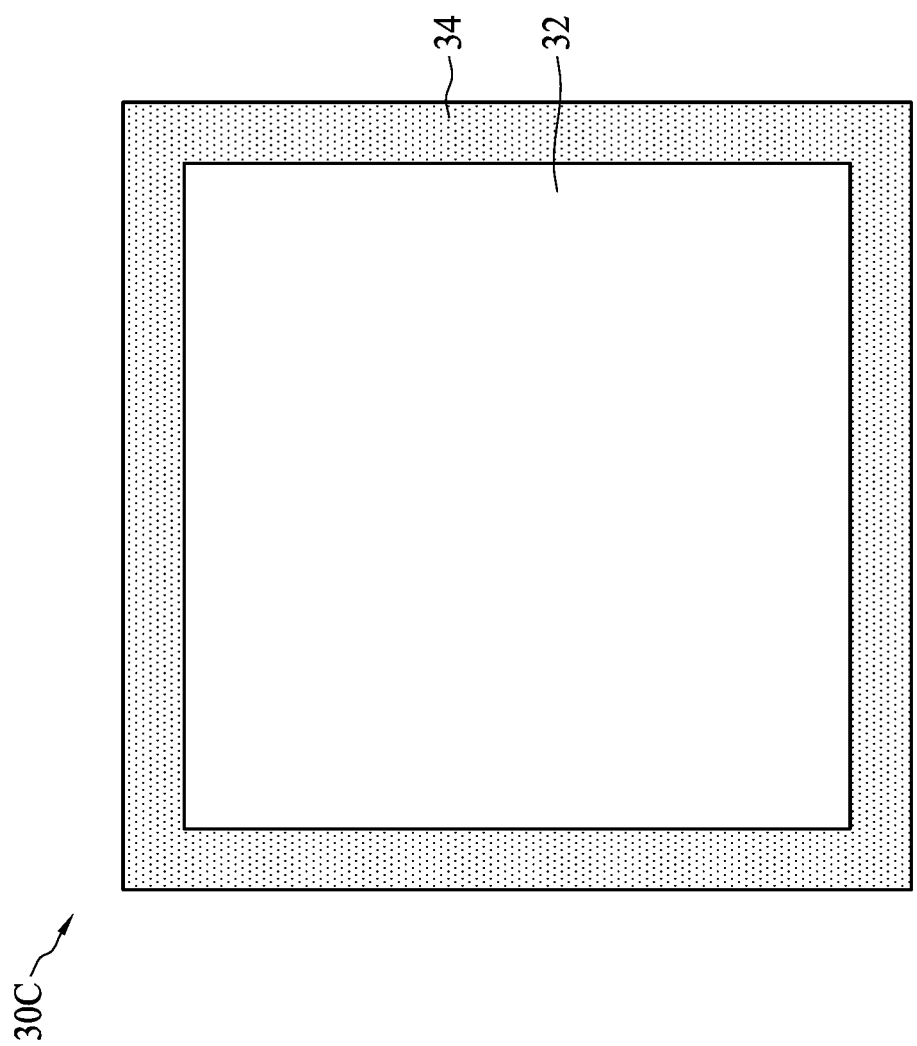
FIGS. 5A to 5N illustrate a method of manufacturing an electroluminescent device according to some embodiments of the present disclosure.

FIGS. 5A to 5M illustrate a method of manufacturing an electroluminescent device according to some embodiments of the present disclosure. As shown in FIG. 5A, a shadow mask 30C is provided. In the present embodiment, the shadow mask 30C is a common metal mask having a hole 32 and a body 34. The shadow mask 30C is configured to define the display area 10D and the peripheral area 10P of a display panel. The shadow mask 30C may have a shape with the hole 32 defining the display area 10D of the substrate 10 and the body 34 defining the peripheral area 10P of the substrate 10. In other words, the hole 32 is over the plurality of pixels 12 in the display area 10D. The shadow mask 30C illustrated in FIG. 5A is a hollow square frame, but is not limited thereto. The shadow mask 30C may have other suitable shapes.

Figure 5B:
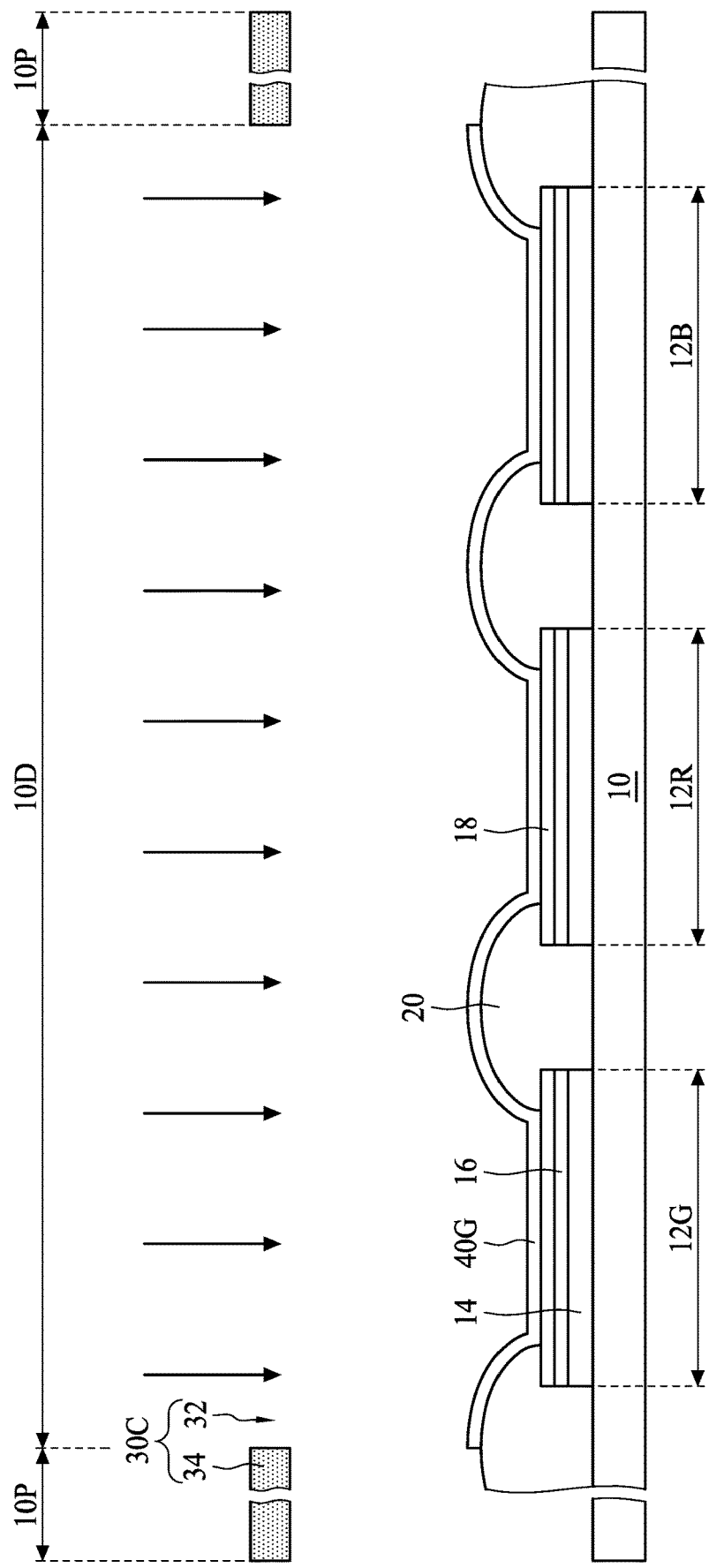

As shown in FIG. 5B, a first light-emitting layer 40G is formed over the substrate 10 using the shadow mask 30C. During the forming of the first light-emitting layer 40G, the hole 32 of the shadow mask 30C is aligned with the first sub-pixel 12G, the second sub-pixel 12R and the third sub-pixel 12B. Moreover, the body 34 of the shadow mask 30C is aligned with the peripheral area 10P of the substrate 10. The first light-emitting layer 40G covers the first sub-pixel 12G and the second sub-pixel 12R. In some embodiments, the first light-emitting layer 40G further covers the third sub-pixel 12B. The first light-emitting layer 40G may be configured to display an image of a first color. In some embodiments, the first light-emitting layer 40G may be configured to display the color green.

In some embodiments, the first light-emitting layer 40G is organic. The first light-emitting layer 40G may be formed by a physical vapor deposition (PVD) process. A heat source evaporates organic light-emitting materials, but vapor deposition can be controlled precisely with the use of a shadow mask 30C. The organic molecules travel through the hole 32 of the shadow mask 30C before reaching the substrate 10. The PVD process can include sputtering (magnetron or ion beam), which utilizes energetic ions colliding with a target to eject (or sputter) target material, or evaporation (thermal resistive and e-beam), which relies on heating a solid source material above its vaporization temperature.

Figure 5C:
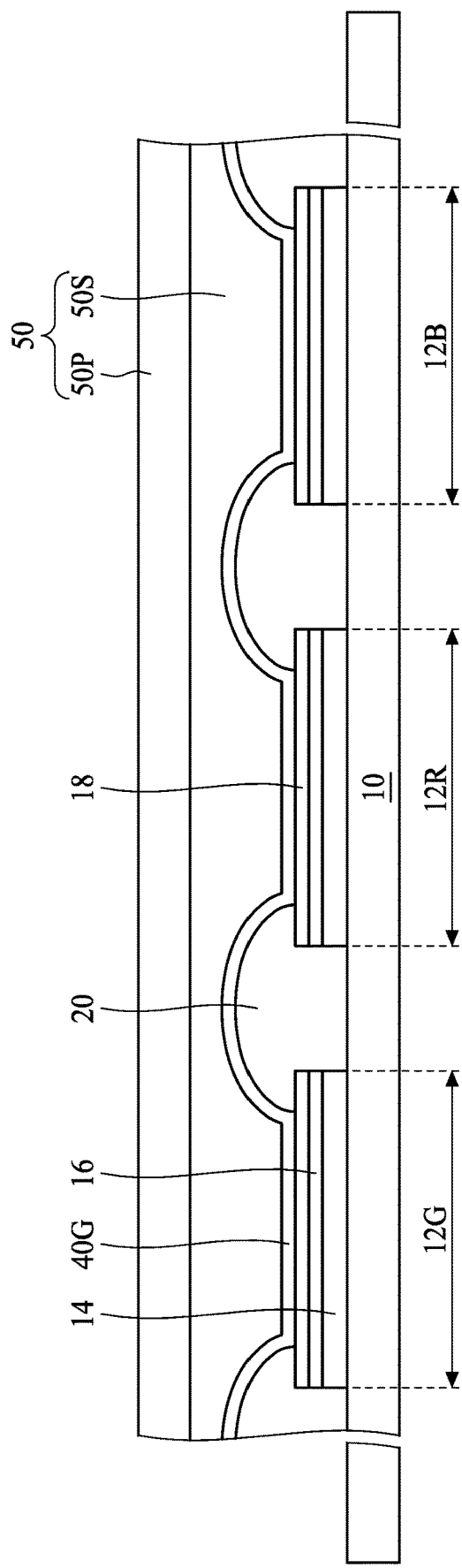

As shown in FIG. 5C, a first sacrificial layer 50 is formed over the substrate 10. The first sacrificial layer 50 covers a portion of the first light-emitting layer 40G that is over the first sub-pixel 12G. In some embodiments, the first sacrificial layer 50 further covers a portion of the first light-emitting layer 40G that is over the second sub-pixel 12R and a portion of the first light-emitting layer 40G that is over the third sub-pixel 12B. In accordance with some embodiments of the present disclosure, the first sacrificial layer 50 includes a photosensitive layer 50P.

The first sacrificial layer 50 may additionally or alternatively include a releasing layer 50S on the substrate 10. The releasing layer 50S may be disposed between the photosensitive layer 50P and the substrate 10. The releasing layer 50S may be served as a planarization layer to increase the flatness of the first sacrificial layer 50 or an adhesion layer to increase the adhesion between the photosensitive layer 50P and the pixel-defining layer 20. In some other embodiments, the first sacrificial layer 50 may further include a barrier layer (not shown) between the photosensitive layer SOP and the releasing layer 50S. The barrier layer may have an etch rate different from those of the photosensitive layer SOP and the releasing layer 50S. Accordingly, a highly selective etch, which leaves the underlying material (the releasing layer 50S) unharmed, may be performed.

Figure 5D:
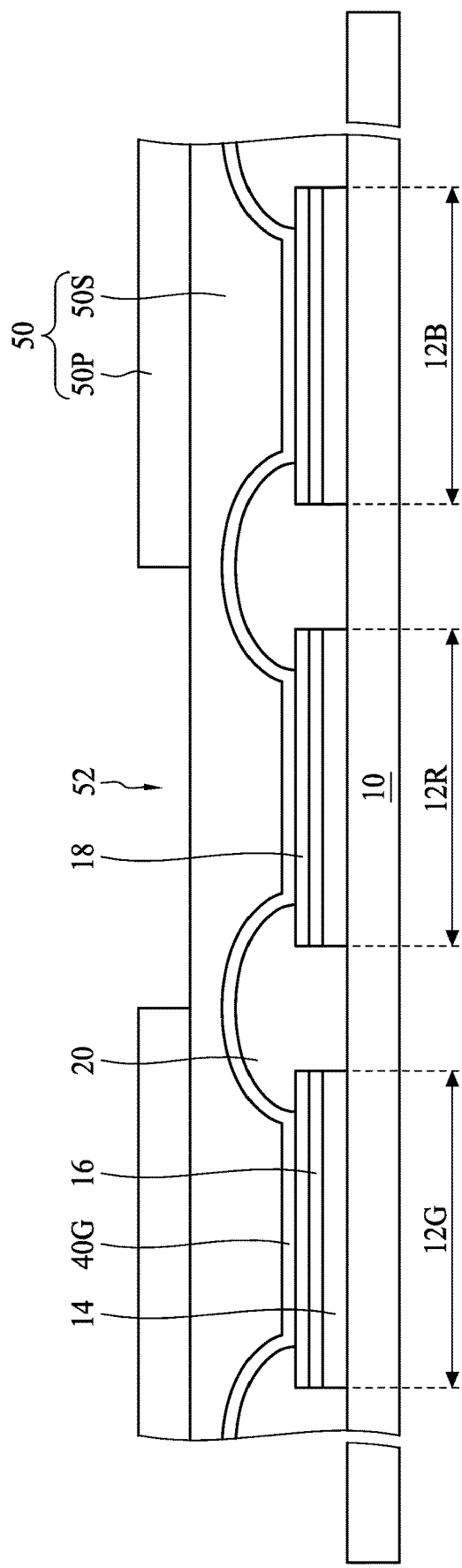

As shown in FIG. 5D, the first sacrificial layer 50 is patterned to form a first opening 52 exposing a portion of the first light-emitting layer 40G that is over the second sub-pixel 12R. Specifically, the photosensitive layer 50P is first patterned by a photolithography process. The photosensitive layer 50P may be heated to a predetermined temperature, then exposed to radiation of a designated wavelength. After exposure, the photosensitive layer 50P is rinsed in a solution for development. A portion of the photosensitive layer 50P is removed and the remaining portion is left substantially covering portions of the first light-emitting layer 40G that are over the first sub-pixel 12G and the third sub-pixel 12B.

Figure 5E:
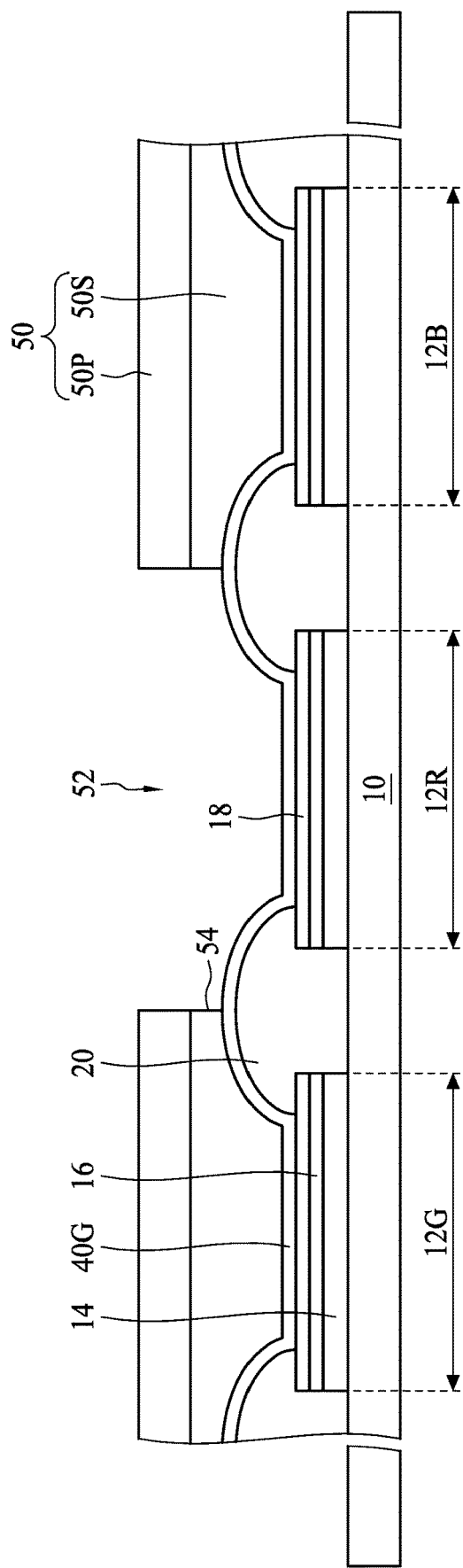

As shown in FIG. 5E, the releasing layer 50S is next patterned to form a recess 54. In accordance with some embodiments of the present disclosure, the patterning of the first sacrificial layer 50 includes patterning the photosensitive layer 50P over the releasing layer 50S, then etching the portions of the releasing layer 50S not covered by the photosensitive layer 50P to pattern the releasing layer 50S.

Figure 5F:
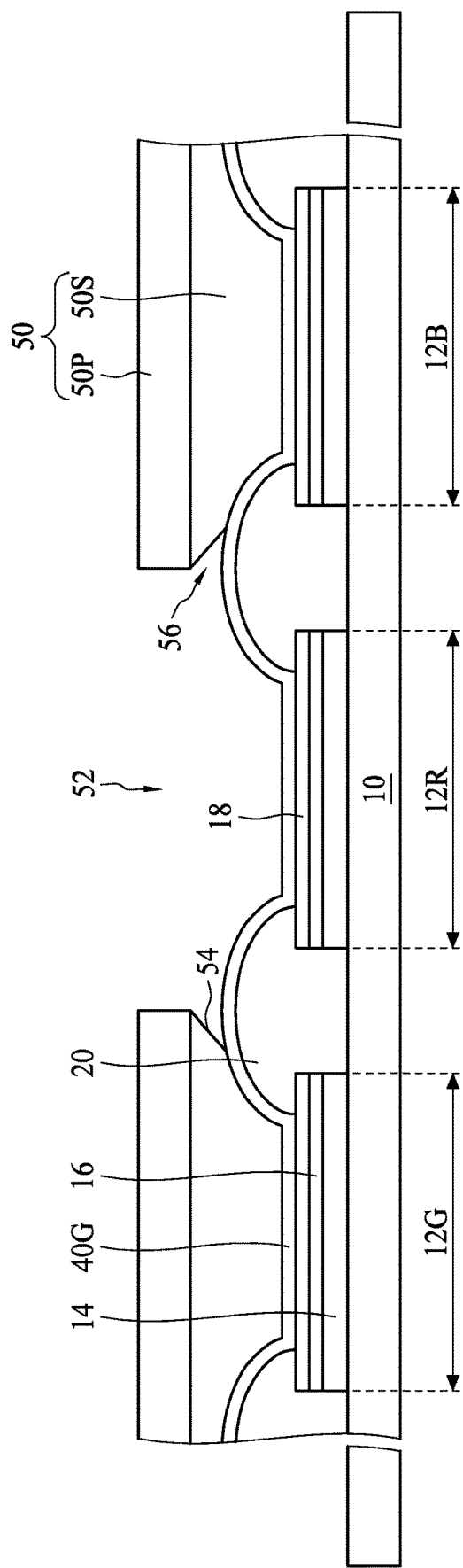

In some embodiments, the releasing layer 50S is patterned by an isotropic etching process such as a wet etching process. Isotropic etching may be used to etch the releasing layer 50S in multiple directions. Accordingly, any horizontal component of the etch direction may therefore result in undercutting of patterned areas. As shown in FIG. 5F, an undercut 56 may be formed to expand the recess 54 further into the releasing layer 50S, and more surfaces of the first light-emitting layer 40G toward the topmost point of the pixel-defining layer 20 may be exposed. Please note that the description below continues to refer to FIG. 5E.

As shown in FIG. 5G, the portion of the first light-emitting layer 40G that is over the second sub-pixel 12R and that is exposed through the first opening 52 of the first sacrificial layer 50 is removed. In other words, the underlying layers such as the electrode 14, the first carrier injection layer 16 or the first carrier transportation layer 18 formed on the second sub-pixel 12R are exposed after the removal of the first light-emitting layer 40G. Accordingly, the second sub-pixel 12R is ready to receive a second light-emitting layer 40R as illustrated in FIG. 5H. In some embodiments, the first light-emitting layer 40G may be removed by wet etching using an etchant such as acetone or other suitable solvent.

As shown in FIG. 5H, the second light-emitting layer 40R is formed over the first sacrificial layer 50 and on the second sub-pixel 12R through the first opening 52 of the first sacrificial layer 50. In some embodiments, not shown in the figures, the second light-emitting layer 40R may further cover the sidewalls of the first opening 52. The formation of the second light-emitting layer 40R may utilize the same procedure as that used in the formation of the first light-emitting layer 40G, but is not limited thereto. The formation of the second light-emitting layer 40R may include other processes as well. The second light-emitting layer 40R may be configured to display an image of a second color. In some embodiments, the second light-emitting layer 40R may be configured to display the color red.

Figure 5I:
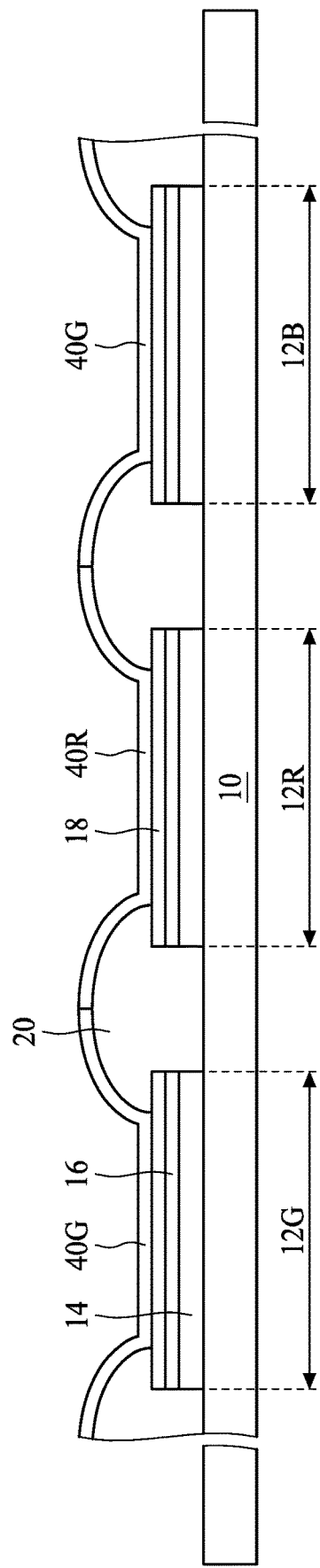

As shown in FIG. 5I, the first sacrificial layer 50 is removed simultaneously with the portion of the second light-emitting layer 40R that is over the first sacrificial layer 50 by a lift-off process. In other words, the sacrificial layer 50 is washed out together with the portion of the second light-emitting layer 40R that is on the surface of the sacrificial layer 50. Accordingly, a portion of the second light-emitting layer 40R that is within the first opening 52 remains in place. As a result, a pixel structure with the first light-emitting layer 40G on the first sub-pixel 12G, the second light-emitting layer 40R on the second sub-pixel 12R, and the first light-emitting layer 40G on the third sub-pixel 12B is formed.

As defined herein, the term "simultaneously" means to remove the first sacrificial layer 50 and the portion of the second light-emitting layer 40R that is over the first sacrificial layer 50 in a single lift-off process. The first sacrificial layer 50 and the portion of the second light-emitting layer 40R that is over the first sacrificial layer 50 may be removed in different steps of the lift-off process, but is not limited thereto. The first sacrificial layer 50 and the portion of the second light-emitting layer 40R that is over the first sacrificial layer 50 may be removed at the same time.

Figure 5J:
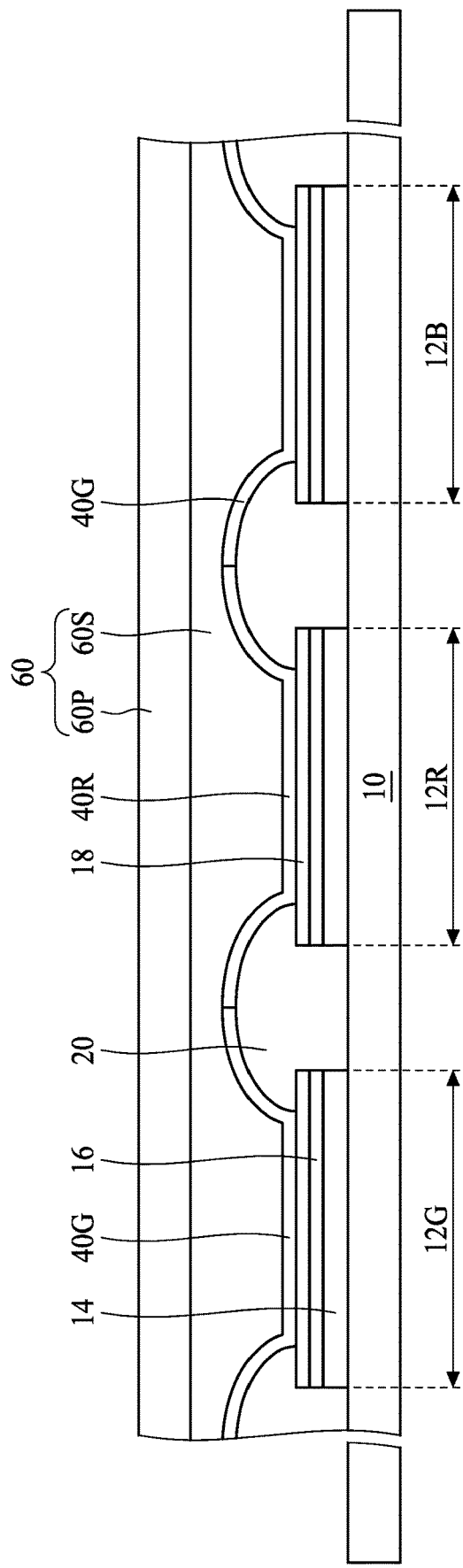

Referring to FIGS. 5J to 5M, operations similar to those illustrated in FIGS. 5C to 5I can be repeated to form a differently-colored light-emitting layer. As shown in FIG. 5J, a second sacrificial layer 60 is formed over the substrate 10. The second sacrificial layer 60 covers the first light-emitting layer 40G on the first sub-pixel 12G and the second light-emitting layer 40R on the second sub-pixel 12R. In some embodiments, the second sacrificial layer 60 further covers the first light-emitting layer 40G on the third sub-pixel 12B. The second sacrificial layer 60 may have the same composition as the first sacrificial layer 50. In some embodiments, the second sacrificial layer 60 may have a composition different from that of the first sacrificial layer 50. In the present embodiment, the second sacrificial layer 60 includes a photosensitive layer 60P and a releasing layer 60S.

Figure 5K:
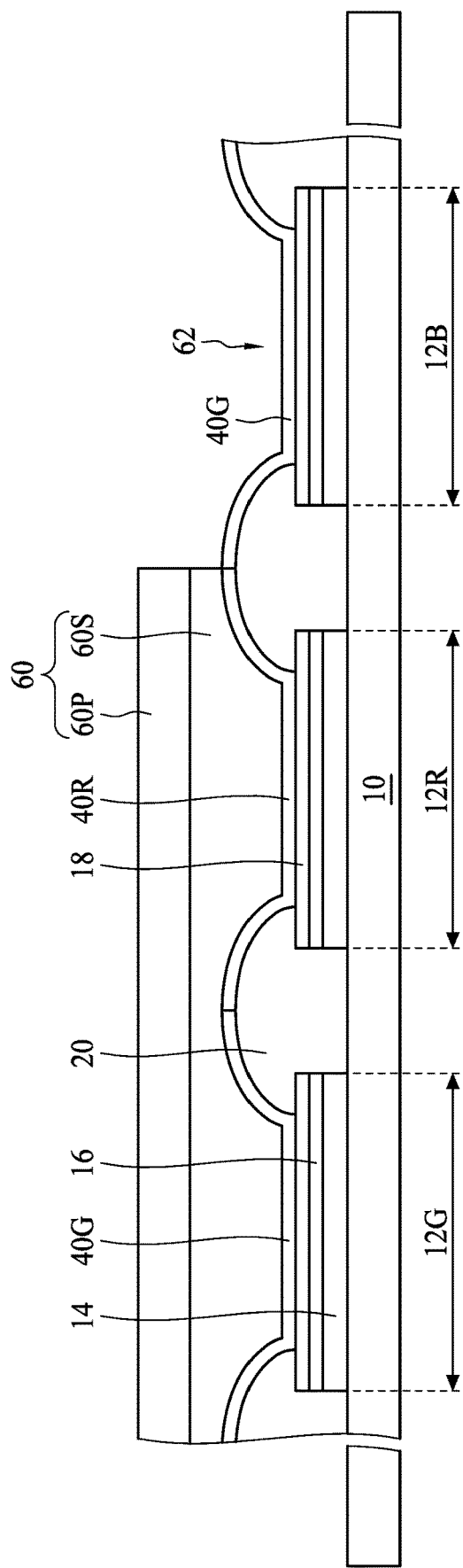
Figure 5L:
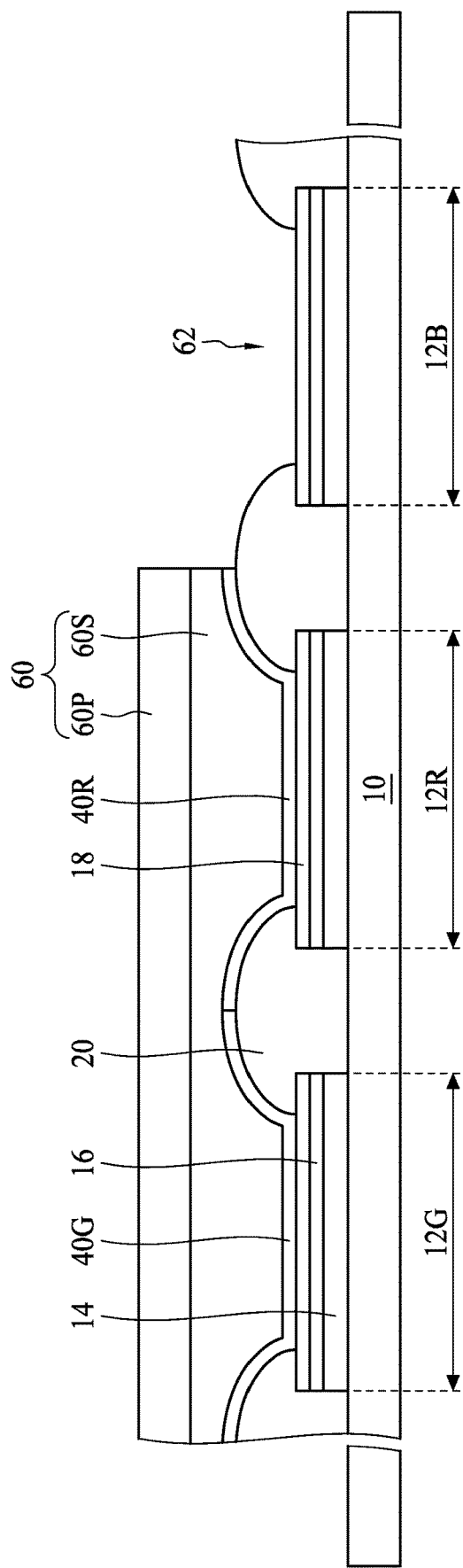
Figure 5M:
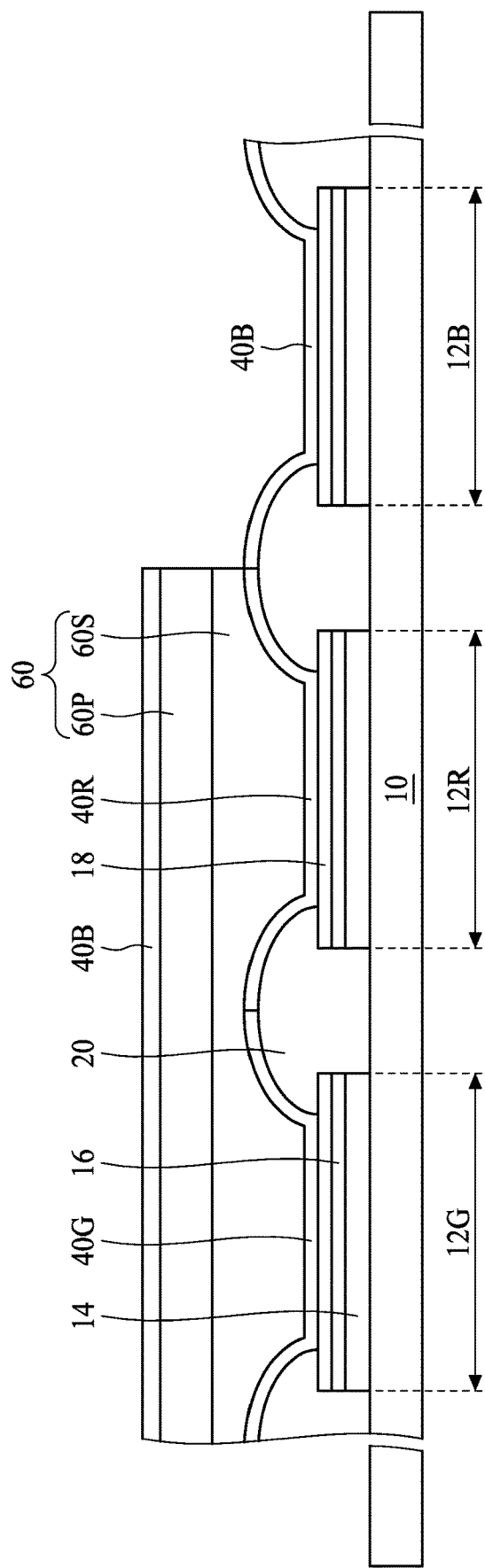

As shown in FIG. 5K, a second opening 62 is formed in the second sacrificial layer 60, exposing the portion of the first light-emitting layer 40G that is over the third sub-pixel 12B. Referring to FIG. 5L, the portion of the first light-emitting layer 40G that is over the third sub-pixel 12B and is exposed through the second opening 62 of the second sacrificial layer 60 is removed. As shown in FIG. 5M, a third light-emitting layer 40B is formed over the second sacrificial layer 60 and on the third sub-pixel 12B through the second opening 62 of the second sacrificial layer 60. The second sacrificial layer 60 is removed simultaneously with a portion of the third light-emitting layer 40B that is over the second sacrificial layer 60 by a lift-off process. The third light-emitting layer 40B may be configured to display an image of a third color. In some embodiments, the third light-emitting layer 40B may be configured to display the color blue.

Boundaries of the first sub-pixel 12G and the first light-emitting layer 40G are defined in part by both the first sacrificial layer 50 and the second sacrificial layer 60. The first sacrificial layer 50 not only defines boundaries of the second sub-pixel 12R and the second light-emitting layer 40R, but also defines the boundaries of the first sub-pixel 12G and the first light-emitting layer 40G. In addition, the second sacrificial layer 60 not only defines boundaries of the third sub-pixel 12B and the third light-emitting layer 40B, but also defines the boundaries of the first sub-pixel 12G and the first light-emitting layer 40G. Accordingly, additional photolithography process is omitted for defining boundaries of the first sub-pixel 12G or the first light-emitting layer 40G. Therefore, the organic light-emitting layers (i.e., the first light-emitting layer 40G, the second light-emitting layer 40R and the third light-emitting layer 40B) suffer less damage incurred by the photolithography processes. Further, the cost of the manufacturing method may be significantly reduced and high resolution of the display panel can be obtained.

Figure 5N:
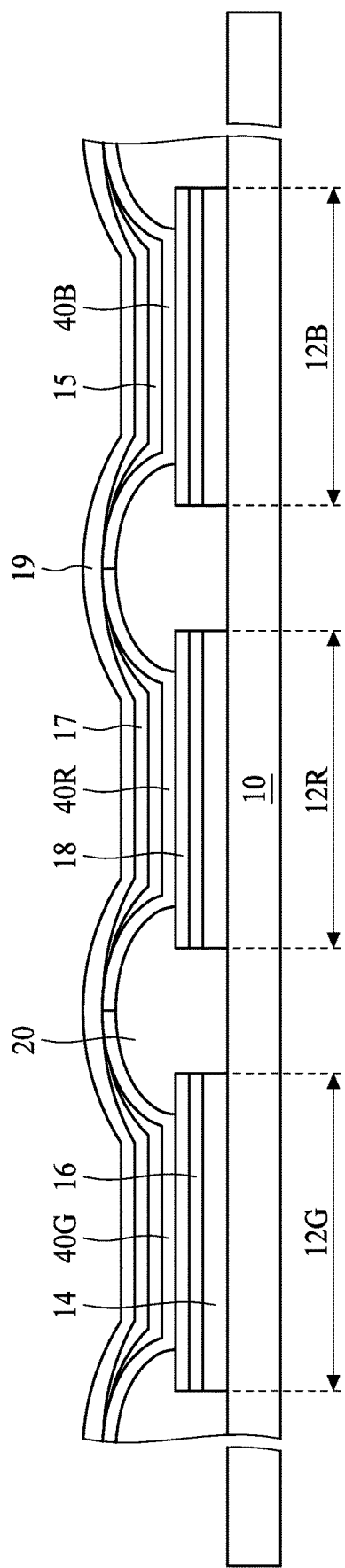

FIG. 5N illustrates an intermediate stage in the manufacturing of an electroluminescent device according to some embodiments. As shown in FIG. 5N, a pixel structure with the first light-emitting layer 40G on the first sub-pixel 12G, the second light-emitting layer 40R on the second sub-pixel 12R, and the third light-emitting layer 40B on the third sub-pixel 12B is obtained. In some embodiments, the sequence of forming the light-emitting layers includes forming the first light-emitting layer 40G, then forming the second light-emitting layer 40R, and finally forming the third light-emitting layer 40B, but the sequence is not limited thereto. The sequence of forming the light-emitting layers of the present disclosure is designed to form the more stable light-emitting layer first, followed by forming of the less stable light-emitting layer(s), but the sequence is not limited thereto. Other suitable sequences of forming for light-emitting layers may be applied as well.

As shown in FIG. 5N, the electroluminescent device further includes a second carrier transportation layer 15, a second carrier injection layer 17, and a conductive layer 19 over the substrate 10. The second carrier transportation layer 15 and the second carrier injection layer 17 may be formed by procedures similar to those used in forming the first carrier injection layer 16 and the first carrier transportation layer 18 described above. The second carrier injection layer 17 may be configured for electron injection or hole injection. The second carrier transportation layer 15 may be configured for electron transportation or hole transportation.

The conductive layer 19 formed on the substrate 10 may include transparent conductive materials or opaque conductive materials. In some embodiments, the electroluminescent device may be a top emission OLED, a bottom emission OLED or a transparent OLED that can be made to be both top- and bottom-emitting. For instance, when the electroluminescent device is a top emission OLED, the conductive layer 19 includes transparent or transmissive conductive materials for light emission and the electrodes 14 include opaque conductive materials. When the electroluminescent device is a bottom emission OLED, the conductive layer 19 includes opaque conductive materials and the electrodes 14 include transparent or transmissive conductive materials. When the electroluminescent device is a transparent emission OLED, both the conductive layer 19 and the electrodes 14 include transparent or transflective conductive materials. The conductive layer 19 may include conductive materials similar to those included in the electrodes 14.

In some embodiments, the conductive layer 19 is designed as a cathode of the electroluminescent device. The conductive layer 19 may be configured to be connected to the driving circuit in the substrate 10 to receive driving signals for driving the electroluminescent device.

As shown in FIG. 5N, the conductive layer 19 is formed to continuously line the surface of the pixel-defining layer 20, but is not limited thereto. The conductive layer 19 may be configured to be broken into segments, wherein each segment is vertically aligned with an electrode 14. The second carrier transportation layer 15 and the second carrier injection layer 17 are configured to be broken into segments, respectively, but are not limited thereto. The second carrier transportation layer 15 and the second carrier injection layer 17 may be formed to continuously line the surface of the pixel-defining layer 20. Similarly, the configuration to arrange each layer either independently for each sub-pixel or shared with other sub-pixels can be based on the aforementioned description, and the embodiments illustrated in the drawings should not be deemed as limitations.

Although not intended to be limiting, the embodiments of the present disclosure provide many benefits to an electroluminescent device manufacturing method. The present disclosure provides a hybrid method of forming the organic light-emitting layers (i.e., the first light-emitting layer 40G, the second light-emitting layer 40R and third light-emitting layer 40B) in the electroluminescent device of a display panel. The method employs applying a shadow masking process to form the first light-emitting layer 40G over the substrate 10. The method also employs two photolithography processes, first performing a selective etch to expose a portion of the pixels, and next forming the second light-emitting layer 40R and the third light-emitting layer 40B with precision. The method provides the electroluminescent device formation process with selective formation and selective etching to overcome the constraints of the shadow masking process.

The method of the present disclosure combines the advantages of the shadow masking process with the advantage of the photolithography process. Since the shadow masking process is applied to the photolithography process, the organic light-emitting layers suffer less damage incurred by the photolithography process. Further, the cost of the manufacturing method may be significantly reduced. Moreover, high resolution can be obtained since the shadow masking process is combined with the photolithography process. Therefore, the high-resolution display panel is formed in a cost-effective way.

Other alternatives or embodiments may be used without departure from the spirit and scope of the present disclosure. FIGS. 6A to 6G illustrate a method of manufacturing an electroluminescent device according to some embodiments of the present disclosure. As shown in FIG. 6A, a first shadow mask 30F is provided. In the present embodiment, the first shadow mask 30F is a fine metal mask having a plurality of holes 36 and a body 38. The holes 36 can be arranged in an array similar to the array of the pixels 12. Each independent hole 36 is separated from other adjacent holes 36. The first shadow mask 30F may have a shape with the hole 36 over a portion of the display area 10D of the substrate 10 and the body 38 covering another portion of the display area 10D of the substrate 10. In other words, the holes 36 are over a portion of the plurality of pixels 12 in the display area 10D. The shape of the first shadow mask 30F illustrated in FIG. 6A is a frame with hollow squares, but the shape is not limited thereto. The first shadow mask 30F may have other suitable shapes.

As shown in FIG. 6B, a first light-emitting layer 40G is formed over the substrate through the first shadow mask 30F. During the forming of the first light-emitting layer 40G, the hole 36 of the first shadow mask 30F is aligned with the first sub-pixel 12G and a portion of the third sub-pixel 12B. Moreover, the body 38 of the first shadow mask 30F is aligned with another portion of the third sub-pixel 12B and the second sub-pixel 12R The first light-emitting layer 40G covers the first sub-pixel 12G and a portion of the third sub-pixel 12B.

As shown in FIG. 6C, a second light-emitting layer 40R is formed over the substrate through a second shadow mask 30F'. During the forming of the second light-emitting layer 40R, the hole of the second shadow mask 30F' is aligned with the second sub-pixel 12R and a portion of the third sub-pixel 12B. The second shadow mask 30F' may have the same design as the first shadow mask 30F. For example, the second shadow mask 30F' may be a fine metal mask having a plurality of holes 36 and a body 38 similar to those of the first shadow mask 30F as shown in FIG. 6A. In some embodiments, the second shadow mask 30F' may have another design and may be different from the first shadow mask 30F.

In some embodiments, the second shadow mask 30F' may be the first shadow mask 30F, and the second light-emitting layer 40R may be formed over the substrate by shifting the first shadow mask 30F to a second position different from the first position. Specifically, during the forming of the first light-emitting layer 40G, the first shadow mask 30F is placed at a position such that the hole 36 of the first shadow mask 30F is aligned with the first sub-pixel 12G and a portion of the third sub-pixel 12B. Next, during the forming of the second light-emitting layer 40R, the first shadow mask 30F is shifted to another position such that the hole 36 of the first shadow mask 30F is aligned with the second sub-pixel 12R and a portion of the third sub-pixel 12B.

The first light-emitting layer 40G may be configured to display an image of a first color. In some embodiments, the first light-emitting layer 40G may be configured to display the color green. The second light-emitting layer 40R may be configured to display an image of a second color. In some embodiments, the second light-emitting layer 40R may be configured to display the color red. The first light-emitting layer 40G and the second light-emitting layer 40R may be organic. In some embodiments, the first light-emitting layer 40G and the second light-emitting layer 40R may be formed by a physical vapor deposition (PVD) process as described above.

Figure 6D:
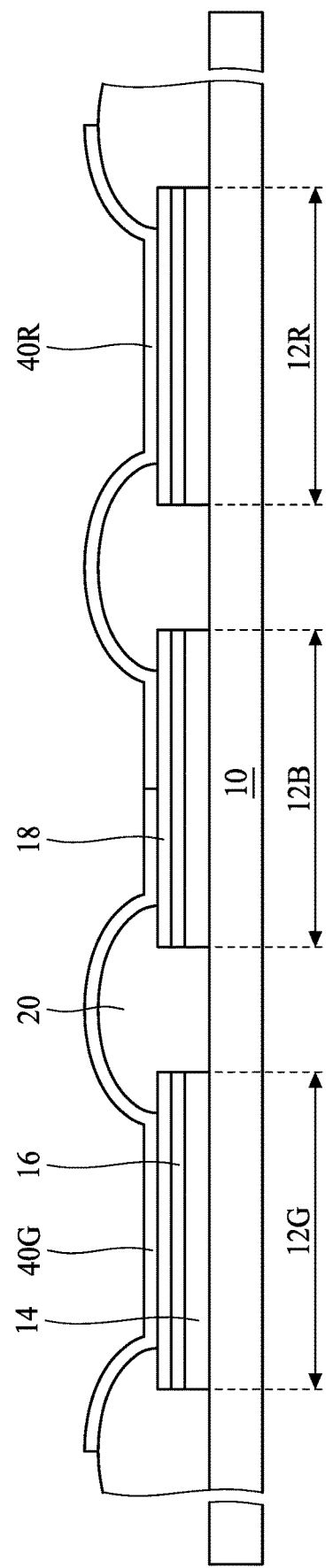

FIG. 6D illustrates an intermediate stage in the manufacturing of an electroluminescent device according to some embodiments. As shown in FIG. 6D, a pixel structure, with the first light-emitting layer 40G over the first sub-pixel 12G and a portion of the third sub-pixel 12B, and the second light-emitting layer 40R over the second sub-pixel 12R and another portion of the third sub-pixel 12B, is formed.

Figure 6E:
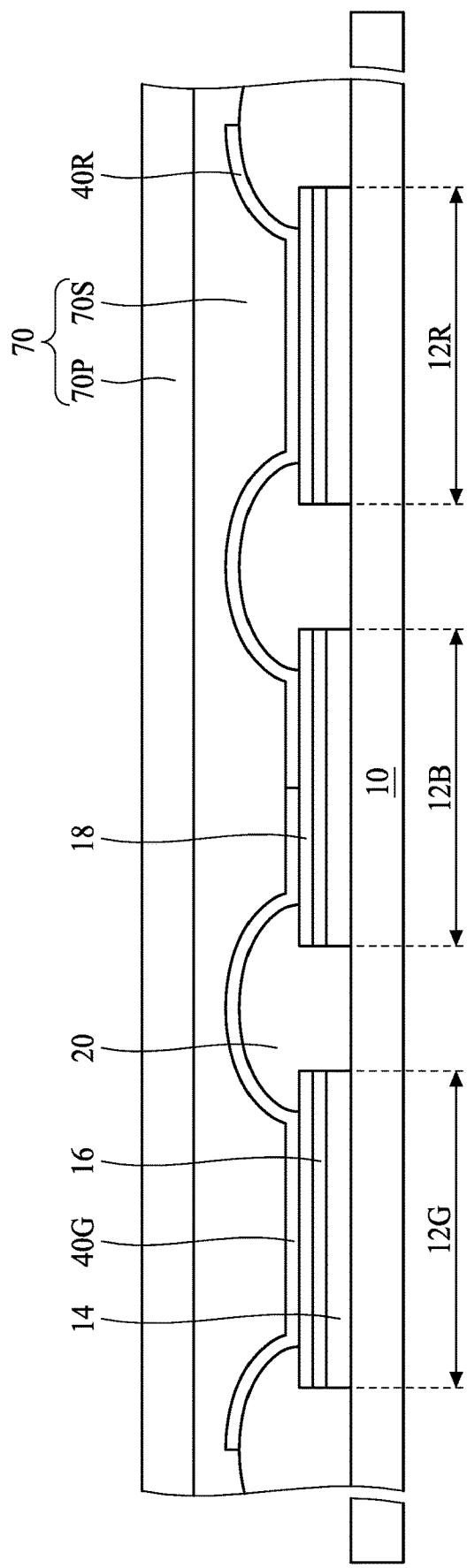

As shown in FIG. 6E, a sacrificial layer 70 is formed over the substrate 10. The sacrificial layer 70 covers the first light-emitting layer 40G over the first sub-pixel 12G and a portion of the third sub-pixel 12B. In some embodiments, the sacrificial layer 70 further covers the second light-emitting layer 40R over the second sub-pixel 12R and another portion of the third sub-pixel 12B. The sacrificial layer 70 may have the same composition as the first sacrificial layer 50 described above. For instance, the sacrificial layer 70 may include a photosensitive layer 70P and a releasing layer 70S. In addition, the material and function of the photosensitive layer 70P and the releasing layer 70S are similar to those of the photosensitive layer 50P and the releasing layer 50S, respectively.

Figure 6F:
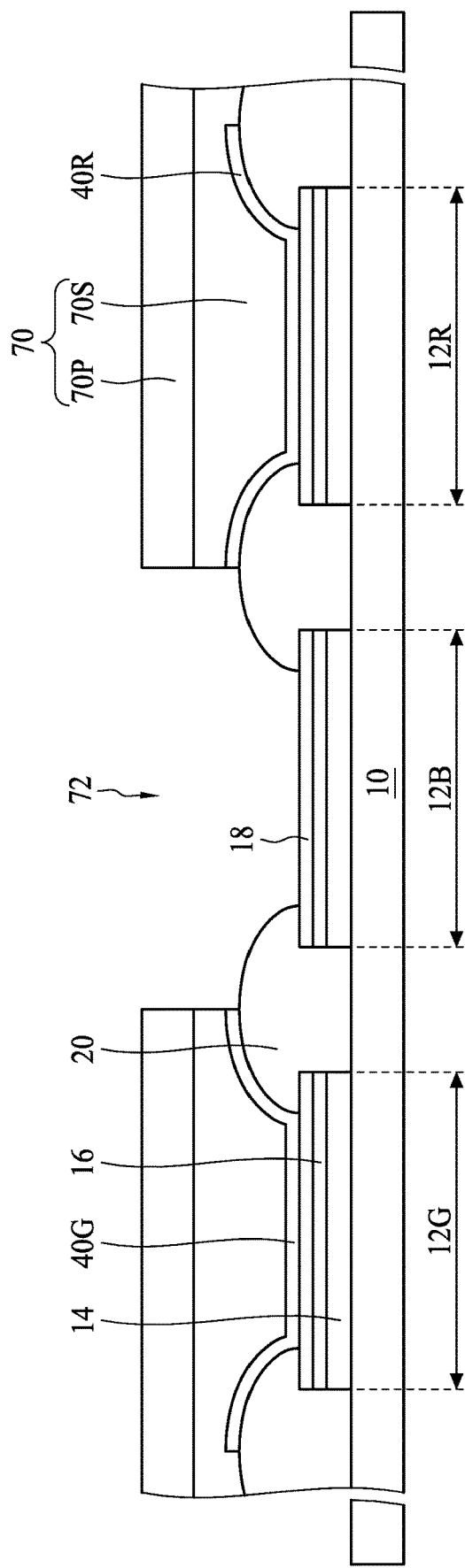

Referring to FIG. 6F, an opening 72 in the sacrificial layer 70 may be formed by performing operations similar to those illustrated in FIGS. 5C to 5E. As shown in FIG. 6F, the sacrificial layer 70 is patterned to form the opening 72 and expose the portions of the first light-emitting layer 40G and the second light-emitting layer 40R that are over the third sub-pixel 12B. In some embodiments, the photosensitive layer 70P is patterned by a photolithography process, then the releasing layer 70S is patterned. In some embodiments, the releasing layer 70S is patterned by an isotropic etching process such as a wet etching process. As shown in FIG. 5F, an undercut may be formed.

Referring to FIG. 6F again, the light-emitting layers on the third sub-pixel 12B may be removed by performing operations similar to those illustrated in FIG. 5G. As shown in FIG. 6F, the portions of the first light-emitting layer 40G and the second light-emitting layer 40R that are over the third sub-pixel 12B and that are exposed through the opening 72 of the sacrificial layer 70 are removed. In other words, the underlying layers such as the electrode 14, the first carrier injection layer 16 and the first carrier transportation layer 18 formed on the third sub-pixel 12B are exposed after the removal of the portions of the first light-emitting layer 40G and the second light-emitting layer 40R. Accordingly, the third sub-pixel 12B is ready to receive a third light-emitting layer 40B as illustrated in FIG. 6G.

Figure 6G:
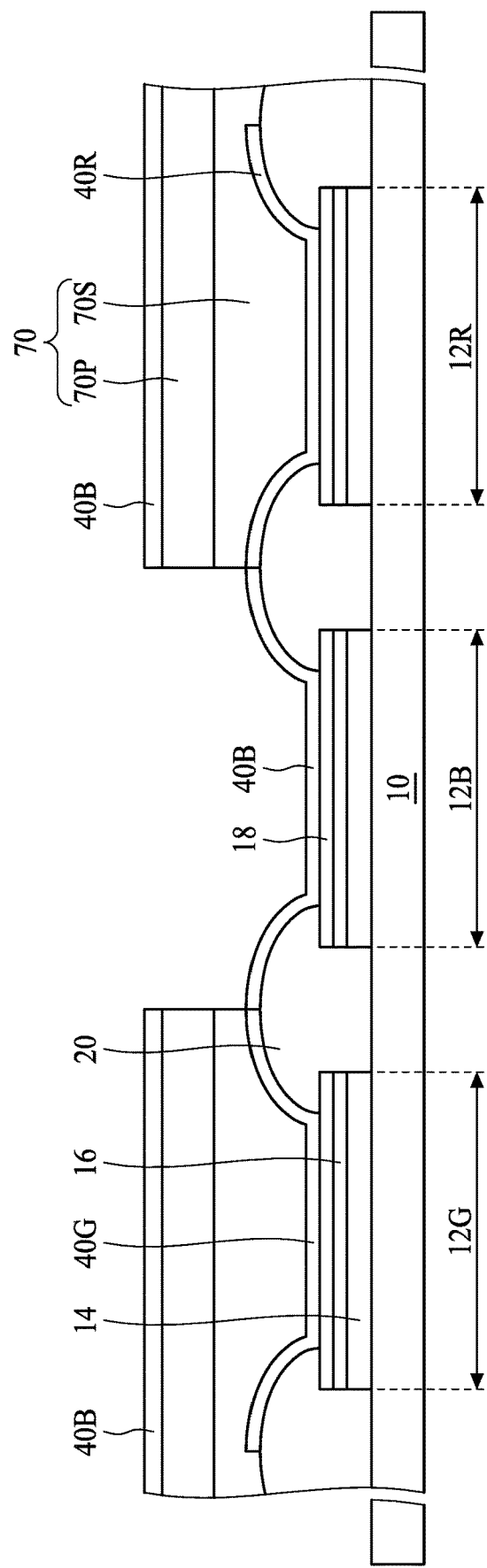

Referring to FIG. 6G, a third light-emitting layer 40B may be formed by performing operations similar to those illustrated in FIG. 5H. As shown in FIG. 6G, the third light-emitting layer 40B is formed over the sacrificial layer 70 and on the third sub-pixel 12B through the opening 72 of the sacrificial layer 70. In some embodiments, not shown in the figures, the third light-emitting layer 40B may further cover the sidewalls of the opening 72. The third light-emitting layer 40B may be configured to display an image of a third color. In some embodiments, the third light-emitting layer 40B may be configured to display the color blue.

Boundaries of the first sub-pixel 12G, the first light-emitting layer 40G, the second sub-pixel 12R and the second light-emitting layer 40R are defined in part by the sacrificial layer 70. The sacrificial layer 70 not only defines boundaries of the third sub-pixel 12B and the third light-emitting layer 40B, but also simultaneously defines the boundaries of the first sub-pixel 12G and the first light-emitting-layer 40R and the boundaries of the second sub-pixel 12R and the second light-emitting layer 40R. Accordingly, additional photolithography process is omitted for defining the boundaries of the first sub-pixel 12G, the first light-emitting layer 40G, the second sub-pixel 12R, or the second light-emitting layer 40R. Therefore, the organic light-emitting layers (i.e., the first light-emitting layer 40G, the second light-emitting layer 40R and the third light-emitting layer 40B) suffer less damage incurred by the photolithography process. Further, the cost of the manufacturing method may be significantly reduced and high resolution of the display panel can be obtained.

As shown in FIGS. 6A to 6G, another hybrid method of forming the organic light-emitting layers in the electroluminescent device is provided. The method employs applying two shadow masking processes to form the first light-emitting layer 40G and the second light-emitting layer 40R over the substrate 10. The method also employs a photolithography process including performing a selective etch to expose the third sub-pixel 12B, and further including precisely forming the third light-emitting layer 40B on the third sub-pixel 12B. The method includes an electroluminescent device formation process with selective formation and selective etching to overcome constraints of the shadow masking process.

The method of the present embodiment employs the advantages of both the shadow masking process and the photolithography process. Further, since the two shadow masking processes are applied, at least two photolithography processes are eliminated. Accordingly, the light exposure from the photolithography process of the organic light-emitting layers is significantly reduced. In addition, the cost of the manufacturing method may be remarkably reduced. Therefore, the high-resolution display panel is formed in a cost-effective way.

Figure 7A:
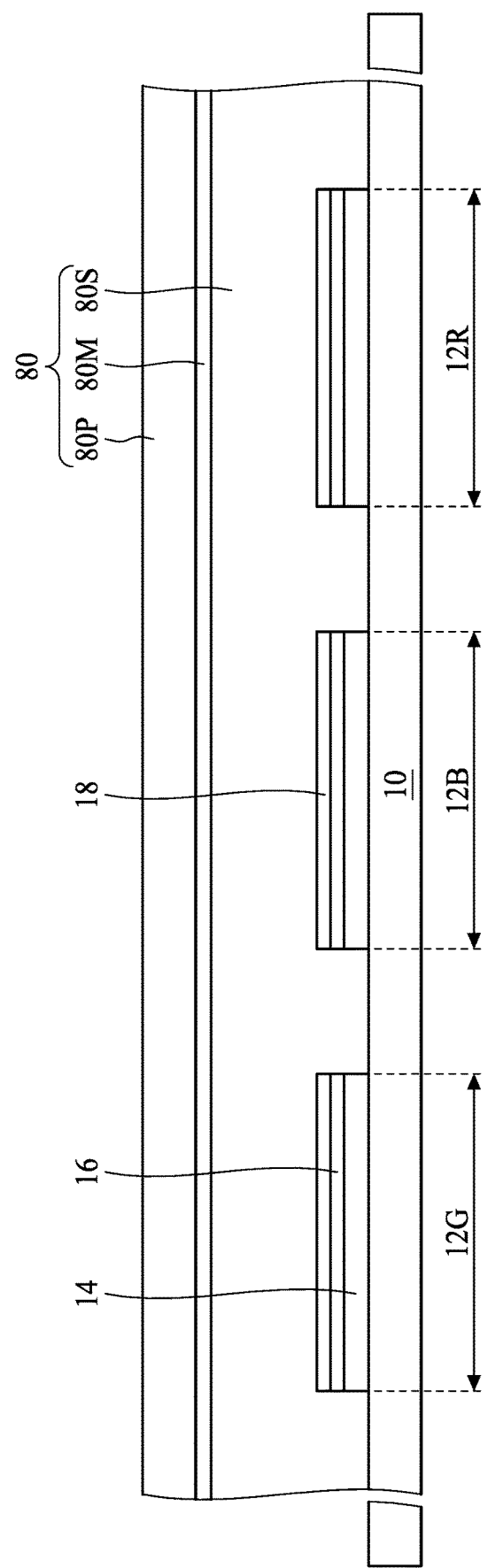

Other alternatives or embodiments may be used without departure from the spirit and scope of the present disclosure. With continued reference to FIG. 3, FIGS. 7A to 7L illustrate a method of manufacturing an electroluminescent device according to some embodiments of the present disclosure. In contrast to the previous embodiments, no pixel-defining layer 20 is present in the electroluminescent device of the present embodiment. As shown in FIG. 7A, a first sacrificial layer 80 is formed over the substrate 10. The first sacrificial layer 80 covers the first sub-pixel 12G, the second sub-pixel 12R and the third sub-pixel 12B. The first sacrificial layer 80 may have the same composition as the first sacrificial layer 50 described above. For instance, the first sacrificial layer 80 may include a photosensitive layer 80P and a releasing layer 80S. In addition, the material and function of the photosensitive layer 80P and the releasing layer 80S are similar to those of the photosensitive layer 50P and the releasing layer 50S, respectively.

The first sacrificial layer 80 may additionally or alternatively include a barrier layer 80M between the photosensitive layer 80P and the releasing layer 80S. The barrier layer 80M may have an etch rate different from those of the photosensitive layer 80P and the releasing layer 80S. Accordingly, a highly selective etch may be performed and leaves the underlying material (the releasing layer 80S) unharmed. In some embodiments, the barrier layer 80M may be a hard mask including metal, metal alloy or other suitable material.

Figure 7B:
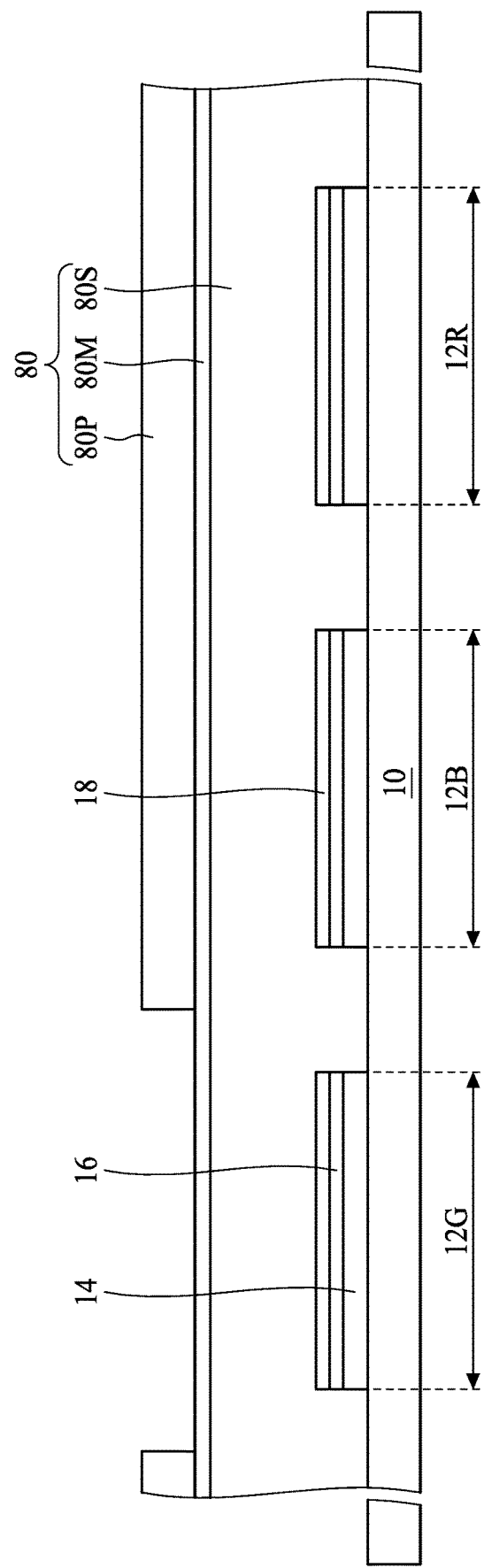
Figure 7C:
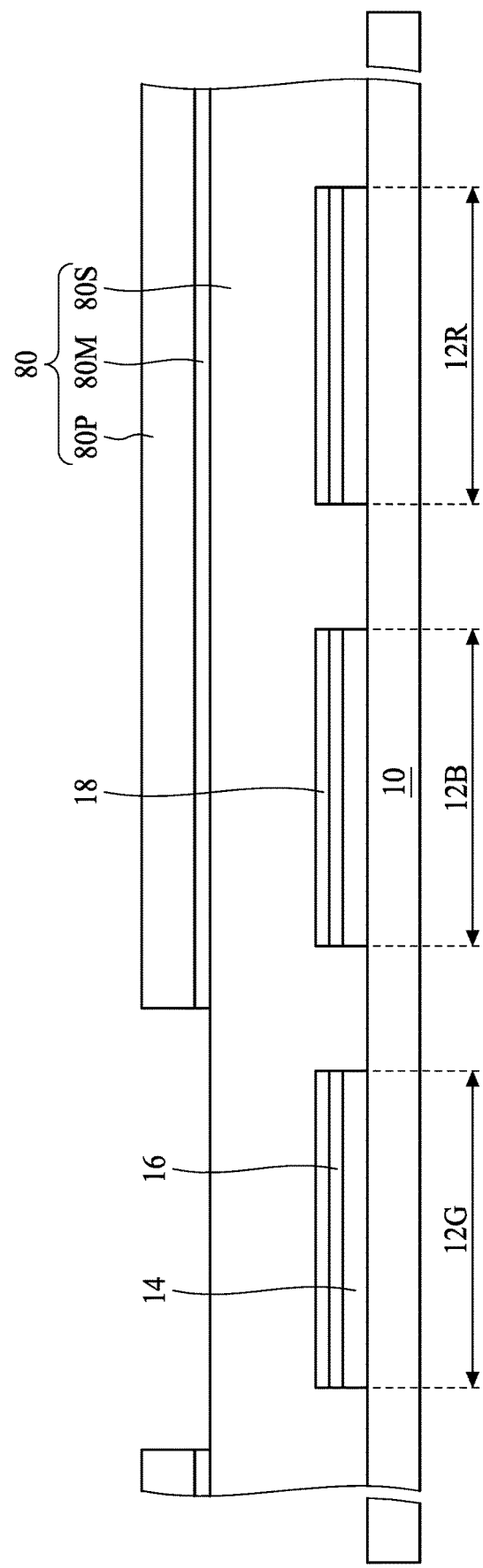
Figure 7D:
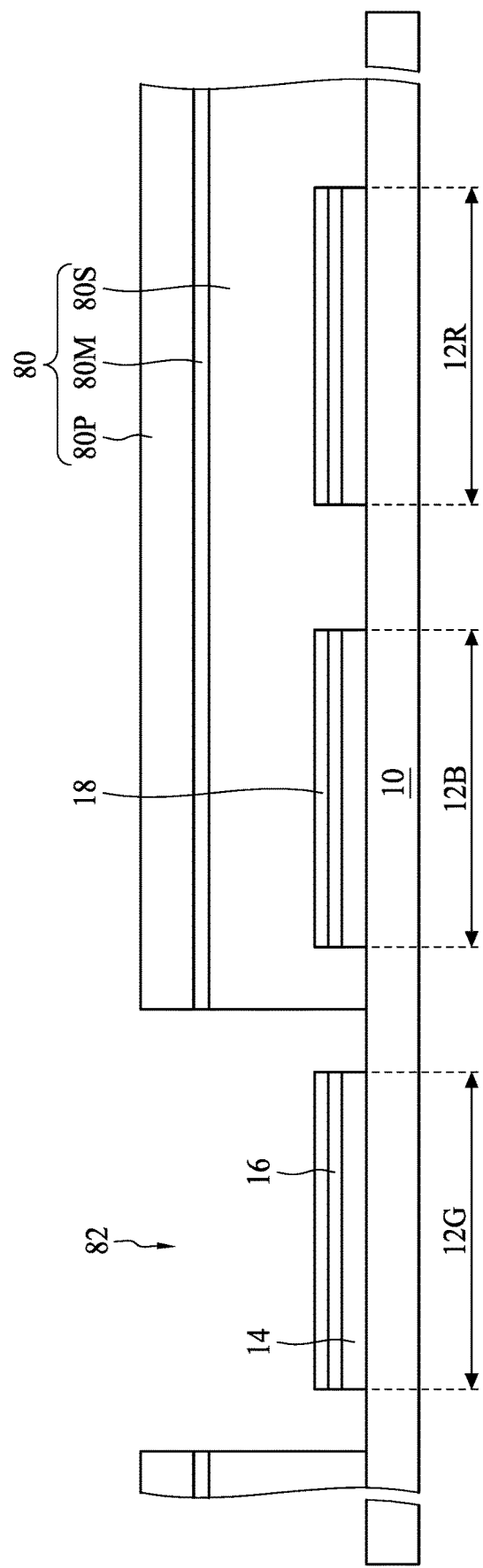

As shown in FIGS. 7B to 7D, the first sacrificial layer 80 may be patterned by performing operations similar to those illustrated in FIGS. 5D to 5E. In accordance with some embodiments of the present disclosure, the barrier layer 80M is patterned by an anisotropic etching process such as a dry etching process. Anisotropic etching removes material in only one direction perpendicular to the surface. Accordingly, the pattern of the photosensitive layer 80P may be accurately transferred, without undercutting of patterned areas. The releasing layer 80S may also be patterned by an anisotropic etching process, and the pattern of the photosensitive layer 80P may be accurately transferred to the releasing layer 80S. Alternatively, the releasing layer 80S may be patterned by an isotropic etching process such as a wet etching process, and an undercut may be formed, similar to the undercut illustrated in FIG. 5F.

Figure 7E:
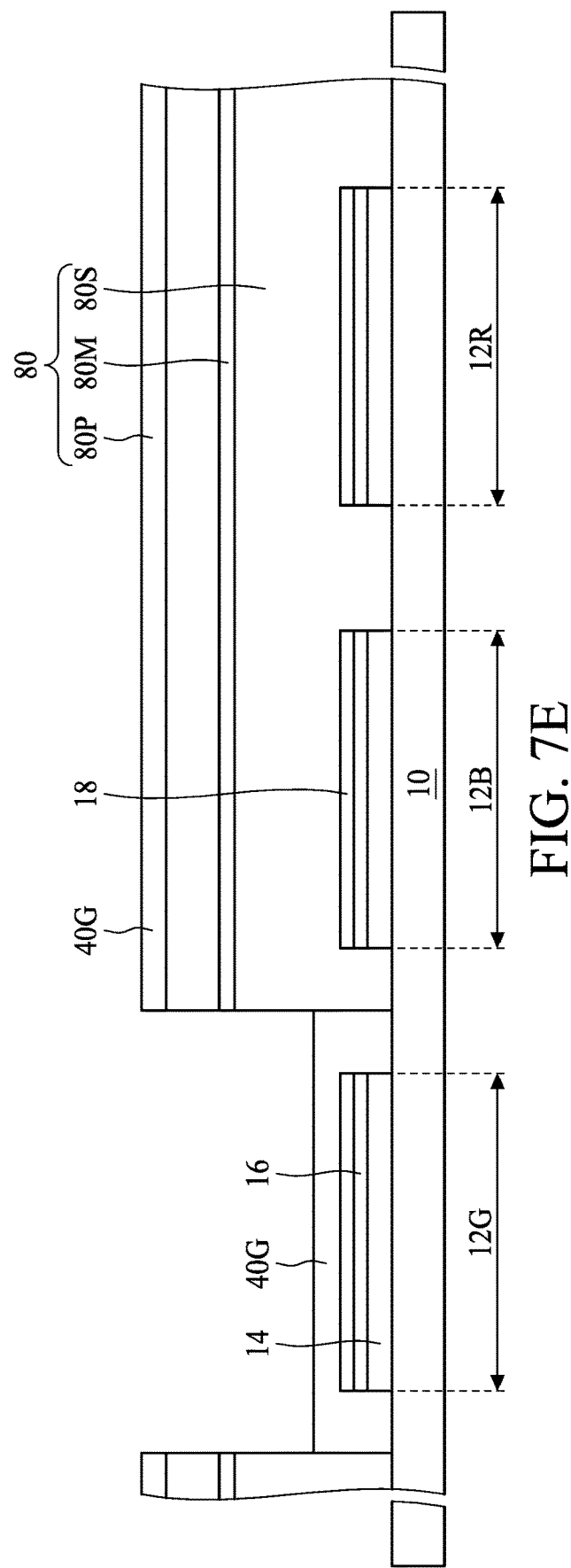
Figure 7F:
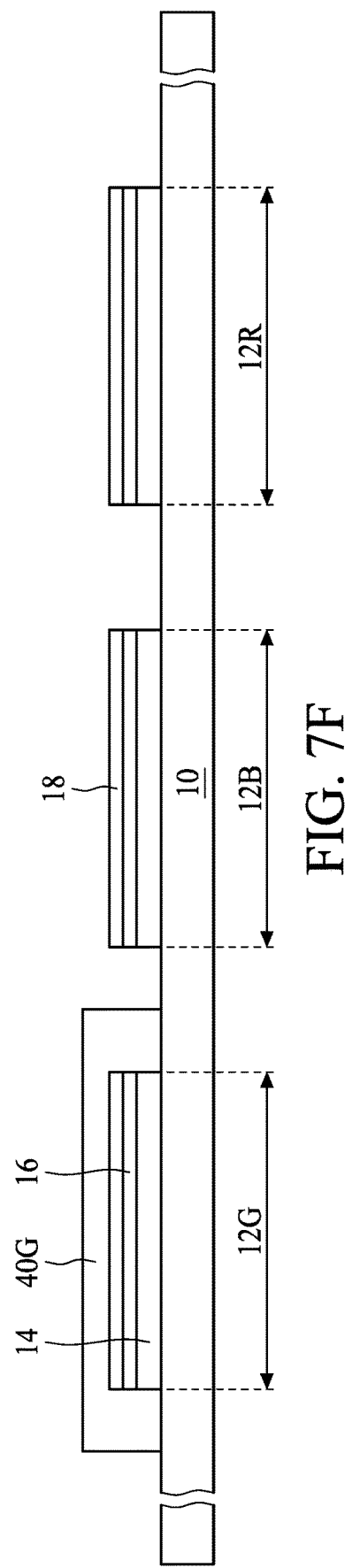

As shown in FIG. 7E, the first light-emitting layer 40G may be formed by performing operations similar to those illustrated in FIG. 5H. The first light-emitting layer 40G is formed over the first sacrificial layer 80 and on the first sub-pixel 12G through the first opening 82 of the first sacrificial layer 80. In some embodiments, not shown in the figures, the first light-emitting layer 40G may further cover the sidewalls of the first opening 82. As shown in FIG. 7F, operations similar to those illustrated in FIG. 5I can be performed to remove the first sacrificial layer 80. In some embodiments, the first sacrificial layer 80 is removed simultaneously with a portion of the first light-emitting layer 40G that is over the first sacrificial layer 80 by a lift-off process.

Figure 7G:
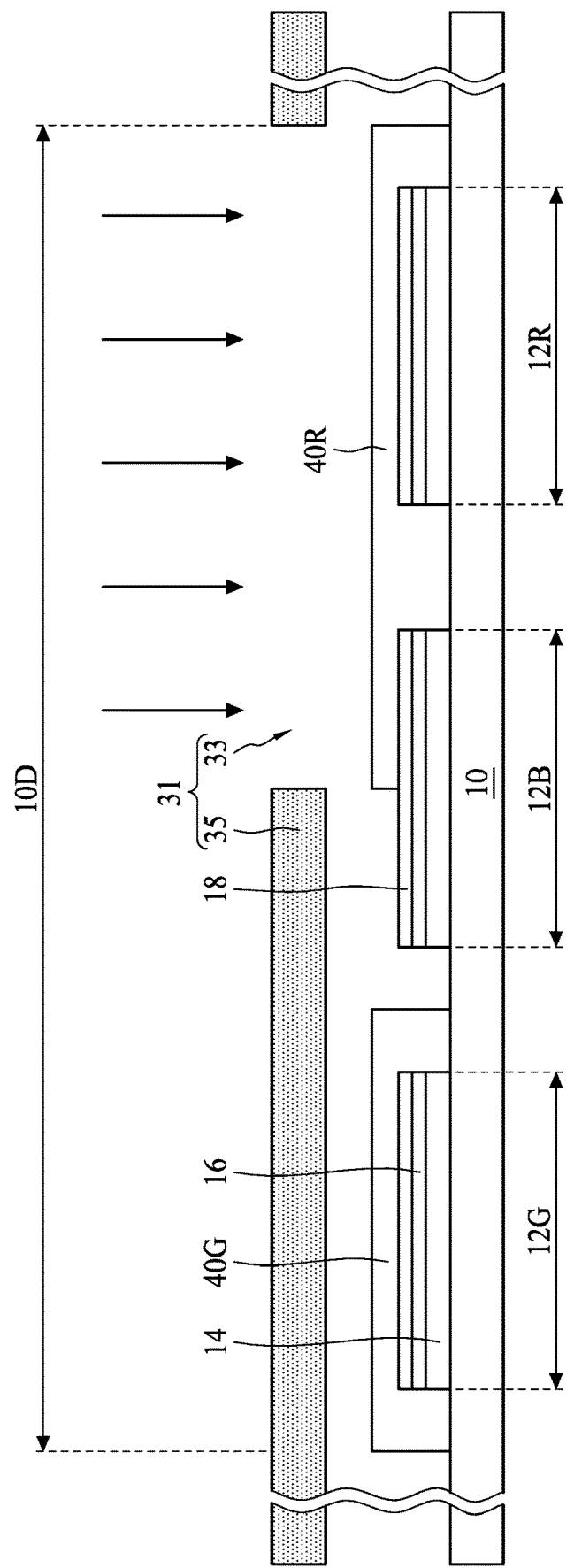

As shown in FIG. 7G, the second light-emitting layer 40R may be formed by performing operations similar to those illustrated in FIG. 6B. As shown in FIG. 7G, the second light-emitting layer 40R is formed over the substrate through a shadow mask 31. The shadow mask 31 may be the same as the first shadow mask 30F described above. During the forming of the second light-emitting layer 40R, the hole 33 of the shadow mask 31 is aligned with the second sub-pixel 12R and a portion of the third sub-pixel 12B. Moreover, the body 35 of the shadow mask 31 is aligned with another portion of the third sub-pixel 12B and the first sub-pixel 12G. As such, the second light-emitting layer 40R covers the second sub-pixel 12R and a portion of the third sub-pixel 12B.

FIG. 7H illustrates an intermediate stage in the manufacturing of an electroluminescent device according to some embodiments. As shown in FIG. 7H, a pixel structure, with the first light-emitting layer 40G on the first sub-pixel 12G, and the second light-emitting layer 40R on the second sub-pixel 12R and on a portion of the third sub-pixel 12B, is formed.

Figure 7I:
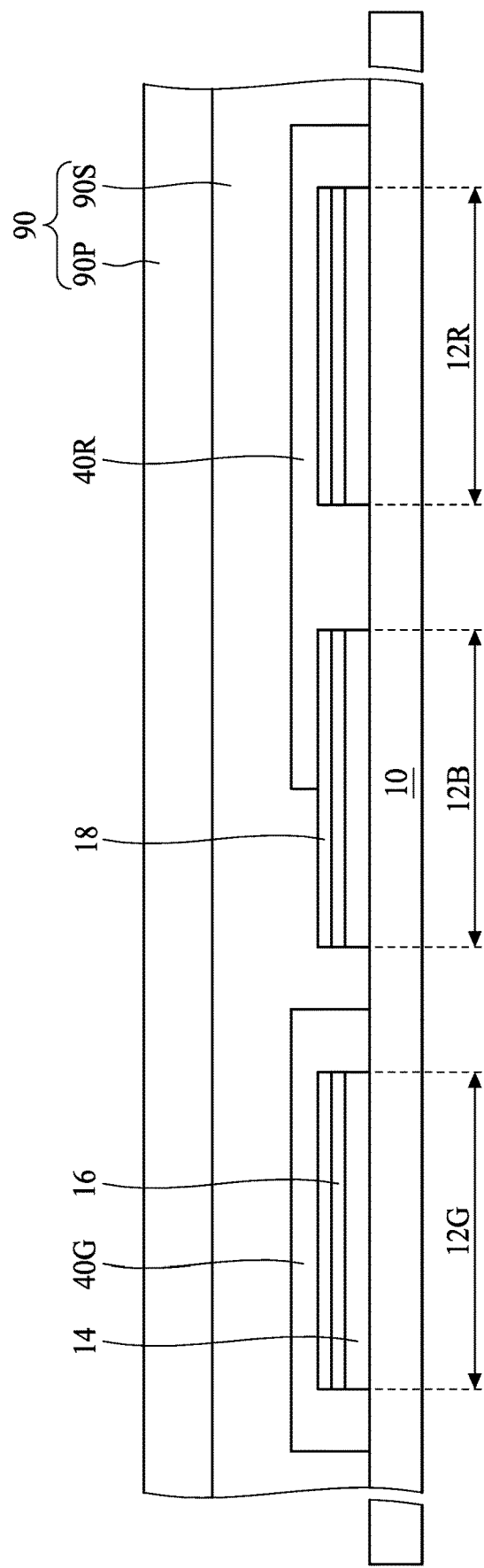

As shown in FIGS. 7I to 7L, the third light-emitting layer 40B may be formed by performing operations similar to those illustrated in FIGS. 5C to 5H. As shown in FIG. 7I, a second sacrificial layer 90 is formed over the substrate 10. The sacrificial layer 90 covers the first light-emitting layer 40G on the first sub-pixel 12G, and covers the second light-emitting layer 40R on the second sub-pixel 12R and on a portion of the third sub-pixel 12B. The second sacrificial layer 90 may have the same composition as the first sacrificial layer 80 described above. For instance, the second sacrificial layer 90 may optionally include a photosensitive layer 90P and a releasing layer 90S. In addition, the material and function of the photosensitive layer 90P and the releasing layer 90S are similar to those of the photosensitive layer 80P and the releasing layer 80S, respectively.

Figure 7J:
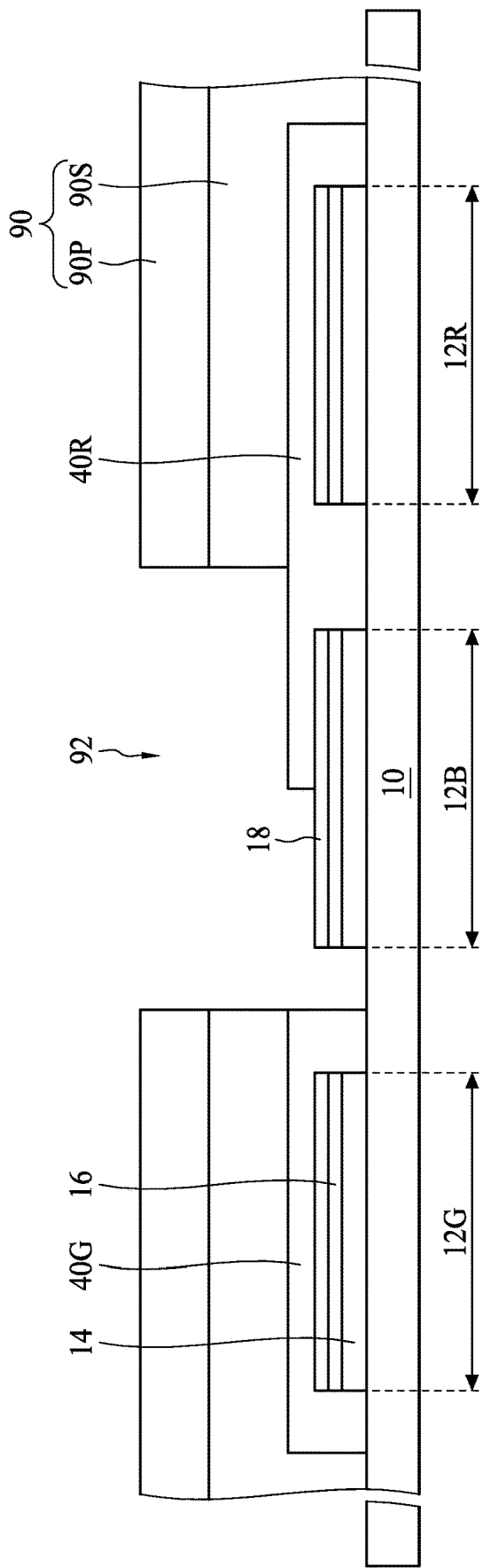
Figure 7K:
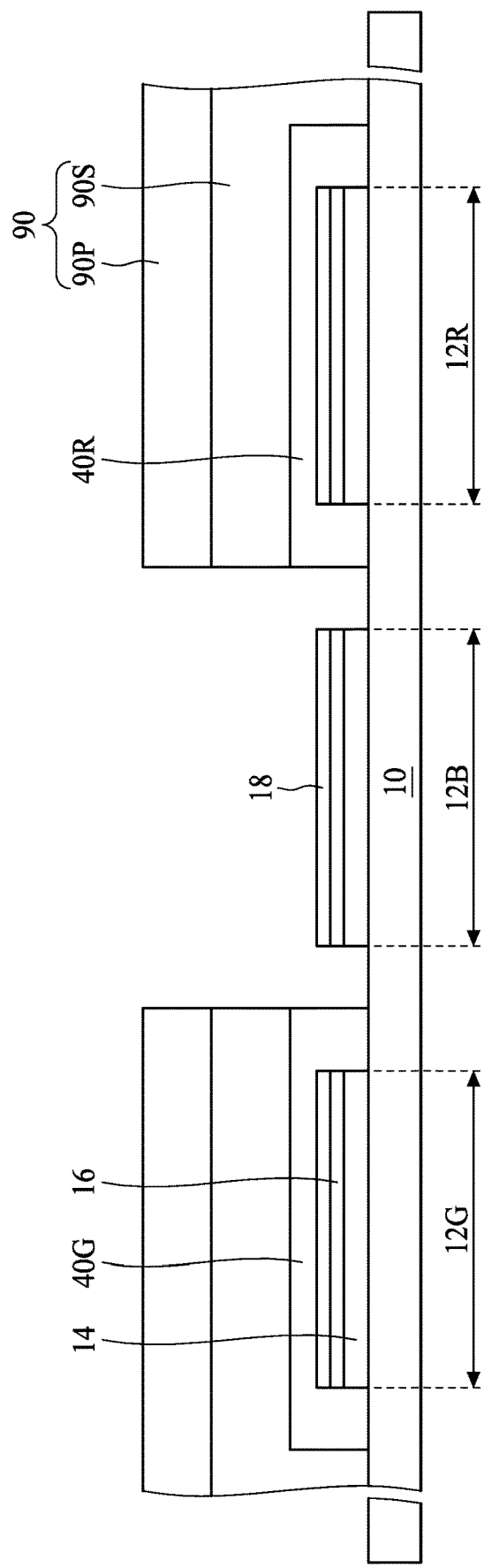

An opening 92 in the second sacrificial layer 90 may be formed by performing operations similar to those illustrated in FIGS. 5C to 5E. As shown in FIG. 7J, the second sacrificial layer 90 is patterned to form the opening 92, thereby exposing a portion of the second light-emitting layer 40R that is on the third sub-pixel 12B. Moreover, operations similar to those illustrated in FIG. 5G can be performed to remove the portion of the second light-emitting layer 40R that is on the third sub-pixel 12B. As shown in FIG. 7K, the portion of the second light-emitting layer 40R that is exposed through the opening 92 of the second sacrificial layer 90 is removed.

Figure 7L:
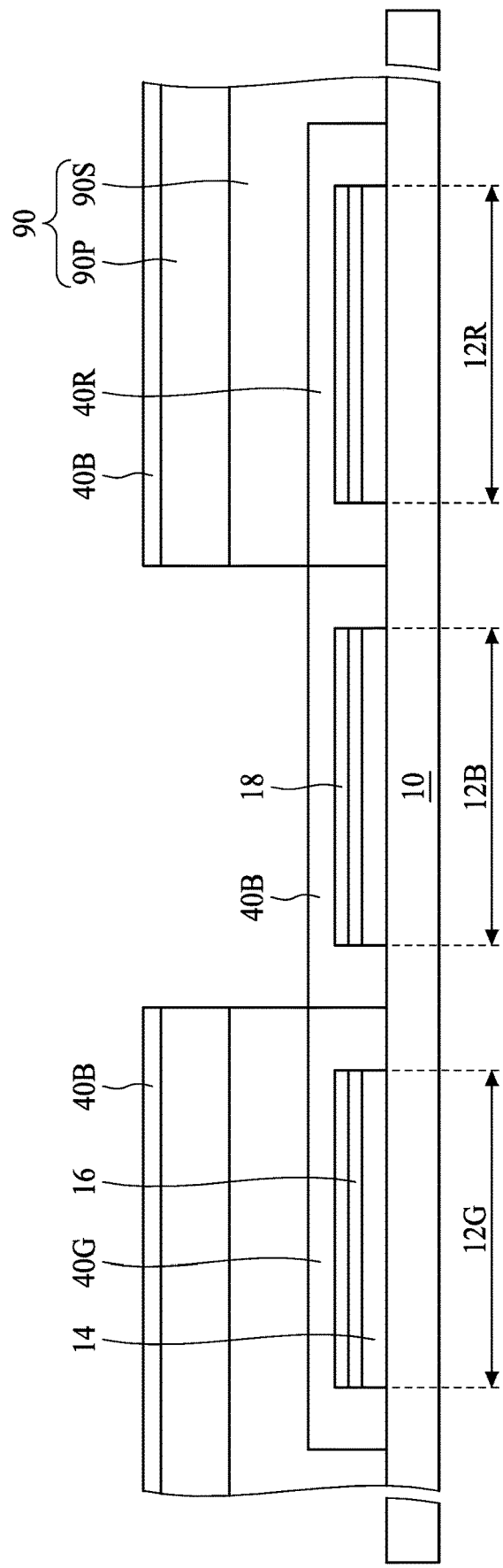

Still referring to FIG. 7K, the underlying layers such as the electrode 14, the first carrier injection layer 16 and the first carrier transportation layer 18 formed on the third sub-pixel 12B are exposed after the removal of the portion of the second light-emitting layer 40R. Accordingly, the third sub-pixel 12B is ready to receive a third light-emitting layer 40B as illustrated in FIG. 7L. Operations similar to those illustrated in FIG. 5H can be performed to form the third light-emitting layer 40B. As shown in FIG. 7L, the third light-emitting layer 40B is formed over the second sacrificial layer 90 and on the third sub-pixel 12B through the opening 92 of the second sacrificial layer 90. In some embodiments, not shown in the figures, the third light-emitting layer 40B may further cover the sidewalls of the opening 92.

Boundaries of the second sub-pixel 12R and the second light-emitting layer 40R are defined in part by the second sacrificial layer 90. The second sacrificial layer 90 not only defines boundaries of the third sub-pixel 12B and the third light-emitting layer 40B, but also defines the boundaries of the second sub-pixel 12R and the second light-emitting layer 40R. Accordingly, additional photolithography process is omitted for defining the boundaries of the second sub-pixel 12R or the second light-emitting layer 40R. Therefore, the organic light-emitting layers (the first light-emitting layer 40G, the second light-emitting layer 40R and the third light-emitting layer 40B) suffer less damage from the photolithography process. Further, the cost of the manufacturing method may be significantly reduced and high resolution of the display panel can be obtained.

As shown in FIGS. 7A to 7L, another hybrid method of forming the organic light-emitting layers in the electroluminescent device is provided. The method includes applying two discontinuous photolithography processes, first to form the first light-emitting layer 40G and the third light-emitting layer 40B, and then one shadow masking process to form the second light-emitting layer 40R over the substrate 10. Accordingly, the method provides an electroluminescent device formation process with selective formation and selective etching to overcome process constraints of the shadow masking process.

Other alternatives or embodiments may be used without departure from the spirit and scope of the present disclosure. In some embodiments, the first light-emitting layer 40G may be formed by inject printing. The first light-emitting layer 40G may cover the first sub-pixel region 12G, the second sub-pixel region 12R and the third sub-pixel region 12B. Further, after the first light-emitting layer 40G is formed, the second light-emitting layer 40R and the third light-emitting layer 40B may be formed by similar processes as shown in FIGS. 5C to 5N.

The present embodiment provides a hybrid method of forming the organic light-emitting layers (i.e., the first light-emitting layer 40G, the second light-emitting layer 40R and third light-emitting layer 40B) in the electroluminescent device of a display panel. The method employs an inject printing process to form the first light-emitting layer 40G over the substrate 10. The method also employs two photolithography processes, first performing a selective etch to expose a portion of the pixels, and next forming the second light-emitting layer 40R and the third light-emitting layer 40B with precision. By combining the photolithography method with the inject printing method, a reduction of the cost of the manufacturing process may be achieved.

Although not intended to be limiting, the embodiments of the present disclosure provide significant improvements to the methods for manufacturing electroluminescent devices. The present disclosure provides hybrid methods of manufacturing the electroluminescent device of the display panel. The methods include applying at least a shadow masking process to form the first light-emitting layer over the substrate. The methods also include one or more photolithography processes, including performing selective etching to expose a portion of the pixels, and next to precisely form the second light-emitting layer. The method overcomes process constraints of the shadow masking process by using selective formation and selective etching. Further, less damage is occurred to the light emitting layer and less manufacturing cost is expected. Therefore, a high-resolution electroluminescent device is formed in a cost-effective manner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing an electroluminescent device, comprising:

providing a substrate including a first sub-pixel region and a second sub-pixel region configured to display an image of a first color and an image of a second color, respectively;

forming a first light-emitting layer over the substrate to cover the first sub-pixel region and at least a portion of the second sub-pixel region;

forming a first sacrificial layer over the substrate, wherein the first sacrificial layer covers a portion of the first light-emitting layer that is over the first sub-pixel region, and the first sacrificial layer includes a first opening exposing a portion of the first light-emitting layer that is over the second sub-pixel region;

removing the portion of the first light-emitting layer that is over the second sub-pixel region and is exposed through the first opening of the first sacrificial layer;

forming a second light-emitting layer over the first sacrificial layer and over the second sub-pixel region through the first opening of the first sacrificial layer; and removing the first sacrificial layer simultaneously with a portion of the second light-emitting layer that is over the first sacrificial layer by a lift-off process.

2. The method of claim 1, wherein the substrate further includes a third sub-pixel region configured to display an image of a third color.

3. The method of claim 2, wherein the first light-emitting layer is formed by inject printing, and the first light-emitting layer covers the first sub-pixel region, the second sub-pixel region and the third sub-pixel region.

4. The method of claim 2, wherein the first light-emitting layer is formed through a common metal mask having a hole aligned with the first sub-pixel region, the second sub-pixel region and the third sub-pixel region, the first light-emitting layer covers the first sub-pixel region, the second sub-pixel region and the third sub-pixel region, and the first sacrificial layer further covers the third sub-pixel region.

5. The method of claim 4, further comprising:

forming a second sacrificial layer over the substrate, wherein the second sacrificial layer covers the portion of the first light-emitting layer that is over the first sub-pixel region, the second sacrificial layer further covers the second light-emitting layer that is over the second sub-pixel region, and the second sacrificial layer includes a second opening exposing a portion of the first light-emitting layer that is over the third sub-pixel region;

removing the portion of the first light-emitting layer that is over the third sub-pixel region and that is exposed through the second opening of the second sacrificial layer;

forming a third light-emitting layer over the second sacrificial layer and on the third sub-pixel region through the second opening of the second sacrificial layer; and removing the second sacrificial layer simultaneously with a portion of the third light-emitting layer that is over the second sacrificial layer by a lift-off process.

6. The method of claim 2, wherein the first light-emitting layer is formed through a first fine metal mask having a hole aligned with the first sub-pixel region and a portion of the second sub-pixel region, and the first light-emitting layer covers the first sub-pixel region and a portion of the second sub-pixel region.

7. The method of claim 6, further comprising:

forming a third light-emitting layer over the substrate through a second fine metal mask to cover the third sub-pixel region and another portion of the second sub-pixel region prior to the forming of the first sacrificial layer; and after the forming of the first sacrificial layer, removing a portion of the third light-emitting layer that is over the second sub-pixel region and is exposed through the first opening of the first sacrificial layer simultaneously with the removing of the first light-emitting layer.

8. The method of claim 6, further comprising:

forming a second sacrificial layer over the substrate prior to the forming of the first light-emitting layer, wherein the second sacrificial layer covers the first sub-pixel region and the second sub-pixel region, and the second sacrificial layer includes a second opening exposing the third sub-pixel region;

forming a third light-emitting layer over the second sacrificial layer and over the third sub-pixel region through the second opening of the second sacrificial layer; and removing the second sacrificial layer simultaneously with a portion of the third light-emitting layer that is over the second sacrificial layer by a lift-off process.

9. The method of claim 1, wherein the first sacrificial layer comprises a photosensitive layer patterned by a photolithography process.

10. The method of claim 9, wherein the first sacrificial layer further comprises a releasing layer between the substrate and the photosensitive layer.

11. The method of claim 10, wherein the first sacrificial layer further comprises a barrier layer between the photosensitive layer and the releasing layer.

12. The method of claim 11, further comprising patterning the barrier layer by a dry etching process.

13. The method of claim 12, further comprising patterning the releasing layer by a dry etching process.

14. The method of claim 12, further comprising patterning the releasing layer by a wet etching process.

15. The method of claim 1, further comprising forming a pixel-defining layer over the substrate to separate the first sub-pixel region from the second sub-pixel region prior to the forming of the first light-emitting layer.

16. The method of claim 1, further comprising forming a plurality of electrodes over the substrate prior to the forming of the first light-emitting layer.

17. The method of claim 1, further comprising forming a conductive layer over the substrate after the removing of the first sacrificial layer.

18. A method of manufacturing a light-emitting device, comprising:

providing a substrate including a first pixel, a second pixel and a third pixel configured to emit different colors;

forming a first light-emitting layer over the substrate through a first shadow mask to cover the first pixel and at least a portion of the third pixel;

forming a second light-emitting layer over the substrate through a second shadow mask to cover the second pixel and at least a portion of the third pixel;

forming a photosensitive layer over the substrate, wherein the photosensitive layer covers a portion of the first light-emitting layer that is over the first pixel and a portion of the second light-emitting layer that is over the second pixel, and the photosensitive layer exposes portions of the first light-emitting layer and the second light-emitting layer that are over the third pixel;

removing the portions of the first light-emitting layer and the second light-emitting layer that are exposed through the photosensitive layer;

forming a third light-emitting layer over the photosensitive layer and over the third pixel; and removing the photosensitive layer simultaneously with a portion of the third light-emitting layer that is over the photosensitive layer.

19. A method of manufacturing a display panel, comprising:

forming a first light-emitting layer over a substrate through a shadow mask, wherein the substrate includes a first pixel, a second pixel and a third pixel;

removing a portion of the first light-emitting layer that is over the second pixel and is exposed through a first photosensitive layer;

forming a second light-emitting layer over the first photosensitive layer and over the second pixel, and removing the first photosensitive layer simultaneously with a portion of the second light-emitting layer that is over the first photosensitive layer;

removing a portion of the first light-emitting layer that is over the third pixel and is exposed through a second photosensitive layer; and forming a third light-emitting layer over the second photosensitive layer and over the third pixel, and removing the second photosensitive layer simultaneously with a portion of the third light-emitting layer that is over the second photosensitive layer.

\* \* \* \* \*